United States Patent
Ryu et al.

(10) Patent No.: US 9,515,135 B2
(45) Date of Patent: *Dec. 6, 2016

(54) EDGE TERMINATION STRUCTURES FOR SILICON CARBIDE DEVICES

(75) Inventors: Sei-Hyung Ryu, Cary, NC (US); Anant K. Agarwal, Durham, NC (US); Allan Ward, Durham, NC (US)

(73) Assignee: Cree, Inc., Durham, NC (US)

( * ) Notice: Subject to any disclaimer, the term of this patent is extended or adjusted under 35 U.S.C. 154(b) by 430 days.

This patent is subject to a terminal disclaimer.

(21) Appl. No.: 11/331,325

(22) Filed: Jan. 12, 2006

(65) Prior Publication Data
US 2006/0118792 A1 Jun. 8, 2006

Related U.S. Application Data

(60) Continuation-in-part of application No. 11/268,789, filed on Nov. 8, 2005, now Pat. No. 7,419,877, which
(Continued)

(51) Int. Cl.
*H01L 31/0312* (2006.01)
*H01L 29/06* (2006.01)
(Continued)

(52) U.S. Cl.
CPC ....... *H01L 29/0619* (2013.01); *H01L 21/0445* (2013.01); *H01L 23/3192* (2013.01);
(Continued)

(58) Field of Classification Search
CPC ............. H01L 21/0445; H01L 23/3192; H01L 29/0615; H01L 29/0619; H01L 29/063
(Continued)

(56) References Cited

U.S. PATENT DOCUMENTS 3,047,439 A 7/1962 Van Daal et al.
3,121,829 A 2/1964 Huizing et al.
(Continued)

FOREIGN PATENT DOCUMENTS

EP 1076363 A2 2/2001
EP 1111688 A1 6/2001
(Continued)

OTHER PUBLICATIONS

Onose et al., Over 2000 V FLR Termination Technologies for SiC High Voltage Devices, The 12$^{th}$ International Symposium on Power Semiconductor Devices and ICs, 2000, Proceedings, May 2000, pp. 245-248.
(Continued)

*Primary Examiner* — Ori Nadav
(74) *Attorney, Agent, or Firm* — Myers Bigel & Sibley

(57) ABSTRACT

An edge termination structure for a silicon carbide semiconductor device includes a plurality of spaced apart concentric floating guard rings in a silicon carbide layer that at least partially surround a silicon carbide-based junction, an insulating layer on the floating guard rings, and a silicon carbide surface charge compensation region between the floating guard rings and adjacent the surface of the silicon carbide layer. A silicon nitride layer is on the silicon carbide layer, and an organic protective layer is on the silicon nitride layer. An oxide layer may be between the silicon nitride layer and the surface of the silicon carbide layer. Methods of forming edge termination structures are also disclosed.

21 Claims, 25 Drawing Sheets

Related U.S. Application Data is a division of application No. 10/731,860, filed on Dec. 9, 2003, now Pat. No. 7,026,650.

(60) Provisional application No. 60/440,193, filed on Jan. 15, 2003.

(51) Int. Cl.
*H01L 21/04* (2006.01)
*H01L 23/31* (2006.01)
*H01L 29/66* (2006.01)
*H01L 29/872* (2006.01)
H01L 29/16 (2006.01)

(52) U.S. Cl.
CPC ........ *H01L 29/063* (2013.01); *H01L 29/6606* (2013.01); *H01L 29/872* (2013.01); H01L 29/0615 (2013.01); H01L 29/1608 (2013.01); H01L 29/66068 (2013.01); H01L 2924/0002 (2013.01); H01L 2924/12044 (2013.01)

(58) Field of Classification Search
USPC ........... 257/40, 77, 127, 170, 483, 484, 640, 642,257/643
See application file for complete search history.

(56) References Cited

U.S. PATENT DOCUMENTS

| | | | |
|---|---|---|---|
| 3,628,187 A | 12/1971 | DeLoach, Jr. et al. | |
| 4,096,622 A | 6/1978 | MacIver | |
| 4,329,699 A | 5/1982 | Ishihara et al. | |
| 4,484,207 A | 11/1984 | Nishizawa et al. | |
| 4,607,270 A | 8/1986 | Iesaka | |
| 4,638,551 A | 1/1987 | Einthoven | |
| 4,720,734 A | 1/1988 | Amemiya et al. | |
| 4,738,937 A | 4/1988 | Parsons | |
| 4,742,377 A | 5/1988 | Einthoven | |
| 4,762,806 A | 8/1988 | Suzuki et al. | |
| 4,765,845 A | 8/1988 | Takada et al. | |
| 4,816,879 A | 3/1989 | Ellwanger | |
| 4,866,005 A | 9/1989 | Davis et al. | |
| 4,875,083 A | 10/1989 | Palmour | |
| 4,901,120 A | 2/1990 | Weaver et al. | |
| 4,907,040 A | 3/1990 | Kobayashi et al. | |
| 4,918,497 A | 4/1990 | Edmond | |
| 5,320,973 A * | 6/1994 | Kobayashi | 438/158 |
| 5,471,072 A | 11/1995 | Papanicolaou | |
| 5,565,384 A * | 10/1996 | Havemann | 438/702 |
| 5,712,502 A | 1/1998 | Mitlehner | |
| 5,789,311 A | 8/1998 | Ueno et al. | |
| 5,801,836 A | 9/1998 | Bakowski et al. | |
| 5,907,179 A | 5/1999 | Losehand et al. | |
| 5,914,500 A | 6/1999 | Bakowski et al. | |
| 5,932,894 A | 8/1999 | Bakowski et al. | |
| 5,977,605 A | 11/1999 | Bakowsky et al. | |
| 5,994,189 A * | 11/1999 | Akiyama | 438/268 |
| 6,002,159 A | 12/1999 | Bakowski et al. | |
| 6,005,261 A | 12/1999 | Konstantinov | |
| 6,040,237 A * | 3/2000 | Bakowski et al. | 438/521 |
| 6,083,814 A | 7/2000 | Nilsson | |
| 6,110,813 A | 8/2000 | Ota et al. | |
| 6,191,015 B1 | 2/2001 | Losehand et al. | |
| 6,313,482 B1 | 11/2001 | Baliga | |
| 6,320,205 B1 | 11/2001 | Pfirsch et al. | |
| 6,445,054 B1 * | 9/2002 | Traijkovic et al. | 257/487 |
| 6,573,128 B1 | 6/2003 | Singh | |
| 6,831,345 B2 * | 12/2004 | Kinoshita et al. | 257/492 |
| 7,026,650 B2 * | 4/2006 | Ryu et al. | 257/77 |
| 7,419,877 B2 | 9/2008 | Ryu et al. | |
| 2003/0132450 A1* | 7/2003 | Minato et al. | 257/110 |
| 2004/0135153 A1 | 7/2004 | Ryu et al. | |

FOREIGN PATENT DOCUMENTS

| | | |
|---|---|---|
| JP | 57-211752 | 12/1982 |
| JP | A-S57-211752 | 12/1982 |
| JP | 58-148469 | 3/1983 |
| JP | 58-140139 | 8/1983 |
| JP | 59-141267 A | 8/1984 |
| JP | 61-137368 A | 6/1986 |
| JP | 62-279672 | 6/1988 |
| JP | 63-133569 | 6/1988 |
| JP | 03-147331 A | 6/1991 |
| JP | 3147331 | 6/1991 |
| JP | 7050420 A | 2/1995 |
| JP | 08-008242 | 1/1996 |
| JP | 087-008242 | 1/1996 |
| JP | A-H08-8242 | 1/1996 |
| JP | 09-064342 A | 3/1997 |
| JP | A-H10-511812 | 11/1998 |
| JP | 11-087331 | 3/1999 |
| JP | A-H11-87331 | 3/1999 |
| JP | A-2005-286197 | 10/2005 |
| TW | 200505018 | 1/2005 |
| WO | WO 96/03774 | 2/1996 |
| WO | WO 97/08754 | 3/1997 |
| WO | WO 01/86727 A | 11/2001 |
| WO | WO 2004/066392 A | 8/2004 |
| WO | WO 2004/066392 A1 | 8/2004 |

OTHER PUBLICATIONS

Examination Report, European Application No. 07 718 354.9, Feb. 3, 2011, 5 pgs.

Japanese Office Action, Japanese Application No. 2006-500992, Jan. 25, 2011.

Decision of Rejection, JP Patent Application No. 2006-500992, Mailing Date: Aug. 16, 2011.

Official Action, JP Patent Application No. 2008-550361, Mailing Date: Nov. 29, 2011.

Official Action, JP Patent Application No. 2006-500992, Mailing Date: Mar. 23, 2012.

Chinese Office Action, Application No. 201210265808.3, Jun. 3, 2014.

Official Action, Japanese Patent Application No. 2011-162517, Mailing Date: Aug. 2, 2013.

Extended European Search Report, EP 10179609.2, Dec. 17, 2013, 8 pages.

Japanese Office Action, Application No. 2012-232939, Jan. 28, 2014.

Official Action, TW Patent Application No. 096101126, Issuance Date: Feb. 6, 20132012.

Official Action, Japanese Patent Application No. 2011-276103, Mailing Date: Oct. 11, 2013.

Chinese Office Action for corresponding Chinese Application No. 200780002384.9 dated Jan. 29, 2010 with translation.

Anikin, M.M. et al. "Electrostatic properties of SiC-6H structures with an abrupt pin junction," *Soviet Physics Semiconductors*. Jan. 1988, vol. 22(1): pp. 80-83.

Appels et al. "High-voltage thin layer devices (RESURF devices)," *IEDM Tech. Dig.*, 1979, pp. 238-241.

Edmond, J.A., J. Ryu, J.T. Glass, and R.F. Davis. "Electrical Contacts to Beta Silicon Carbide Thin Films." *Journal of the Electromechanical Society*. vol. 135, No. 2, Feb. 1988, pp. 359-362.

Glover, G.H. "Charge Multiplication in Au—SiC (6H) Schottky Junctions." *Journal of Applied Physics*. Nov. 1975, vol. 46, No. 11: pp. 4842-4844.

International Search Report and Written Opinion of the International Searching Authority for corresponding PCT application No. PCT/US2004/001183, mailed Jul. 7, 2004.

Ioannou et al. "The Effect of Heat Treatment on Au Schottky Contacts on β-SiC." *IEEE Transactions on Electron Devices*. Aug. 1979, vol. Ed-34, No. 8: pp. 1694-1699.

Ioannou, D.E. and N.A. Papanicolaou. "Deep Level Transient Spectroscopy of β-SiC Layers." *Abstracts*. Fourth National Review

(56) References Cited

OTHER PUBLICATIONS

Meeting on Growth and Characterization of SiC and Its Employment in Semiconductor Applications. (Abstract).

Kinoshita et al. "Guard Ring Assisted RESURF: A New Termination Structure Providing Stable and High Breakdown Voltage for SiC Power Devices," Tech. Digest of ISPSD '02, pp. 253-256.

Konstantinov, A.O. "Ionization Rates and Critical Fields in 4H Silicon Carbide," *Appl. Phys. Lett.* vol. 71, No. 1, Jul. 1997, pp. 90-92.

Kosiachenko, L.A. and E.F. Kukhta, V.M. Skiliarchuk, "Light Emission from Metal at Forward Bias of a Shottky Diode," *Zhurnal tekhnicheskoi fiziki* [*Journal of Technical Physics*], vol. 54, No. 6, 1984.

Kyoritsu Shuppan Kabushiki Kaisha, *Crystallography Handbook.*

Li et al. "Theoretical and Experimental Study of 4H—SiC Junction Edge Termination," Materials Science Forum, vols. 338-342 (2000), pp. 1375-1378.

Li et al. "Electro-Chemical Mechanical Polishing of Silicon Carbide" *Materials Science Forum* vol. 457-460 pp. 801-804 (2004).

Merchant et al. "Realization of High Breakdown Voltage (>700V) in Thin SOI Devices," *Tech. Digest of ISPSD '91*, pp. 31-34.

Onose et al. *Over 2000 V FLR Termination Technologies for SiC High Voltage Devices*, 12th International Symposium on Power Semiconductor Devices and IC's. Toulousse, France, May 22-25, 2000.

Pelletier, J., D. Gervais, and C. Pomot. "Application of Wide Gap Semiconductors to Surface Ionization: Work Functions of AIN and SiC Crystals." *Journal of Applied Physics*. vol. 55, No. 4. Feb. 15, 1984, pp. 994-1002.

Powell, J.A. "Silicon Carbide: Progress in Crystal Growth." *Material Research Society Symposium Proceedings*. 1987, vol. 97: pp. 159-168.

Saidov, M.S., Kh. A. Shamuratov, and A. Umurzakov. "Current-voltage characteristics of silicon carbide heterojunctions." *Soviet Physics of Semiconductors*. vol. 13, No. 9, Sep. 1979, pp. 1054-1056.

Singh, R. and J.W. Palmour, "Planar Terminations in 4H—SiC Schottky Diodes with Low Leakage and High Yields," *IEEE International Symposium on Power Semiconductor Devices and ICs*, 1997.

Streetman, B.G. *Solid State Electronic Devices*. Second Edition, Prentice-Hall, 1980, pp. 192-193, 201, 443.

Sze, S.M. *Physics of Semiconductor Devices*, John Wiley & Sons, p. 250-254.

*The Electrical Engineering Handbook*, Richard C. Dorf, editor, Second Edition, CRC/IEEE Press.

Ueno et al. "The Guard-Ring Termination for High-Voltage SiC Schottky Barrier Diodes" *IEEE Electron Device Letters* 16(7): 331-332 (1995).

Violin, E.E., et al. "Light Emitting Devices Based on Silicon Carbide." *Silicon Carbide*. 1973, p. 565. (edited by Marshall, Faust, Ryan).

Waldrop, J.R. and R.W. Grant. "Formation and Schottky barrier height of metal contacts to β-SiC." *Applied Physics Letters*. vol. 56, No. 6, Feb. 5, 1990, pp. 557-559.

Yilmaz, Hamza, "Optimization and Surface Charge Sensitivity of High Voltage Blocking Structures with Shallow Junctions," *IEEE Transactions on Electron Devices*, vol. 38, No. 3, Jul. 1991, pp. 1666-1675.

Ioannou, D.E. and N.A. Papanicolaou. "Deep Level Transient Spectroscopy of β-SiC Layers." Abstracts. Fourth National Review Meeting on Growth and Characterization of SiC and Its Employment in Semiconductor Applications. (Abstract), Applied Physics Letters, 51(14), Oct. 1987.

Kinoshita et al. "Guard Ring Assisted RESURF: A New Termination Structure Providing Stable and High Breakdown Voltage for SiC Power Devices," Tech. Digest of ISPSD '02, pp. 253-256, 2002.

Merchant et al. "Realization of High Breakdown Voltage (>700V) in Thin SOI Devices," *Tech. Digest of ISPSD '91*, pp. 31-34, 1991.

Sze, S.M. *Physics of Semiconductor Devices*, John Wiley & Sons, p. 250-254, Oct. 2006.

*The Electrical Engineering Handbook*, Richard C. Dorf, editor, Second Edition, CRC/IEEE Press, Sep. 26, 1997.

Kyoritsu Shuppan Kabushiki Kaisha, *Crystallography Handbook*, Date Not Found.

\* cited by examiner

X-field

Y-field

Y-field

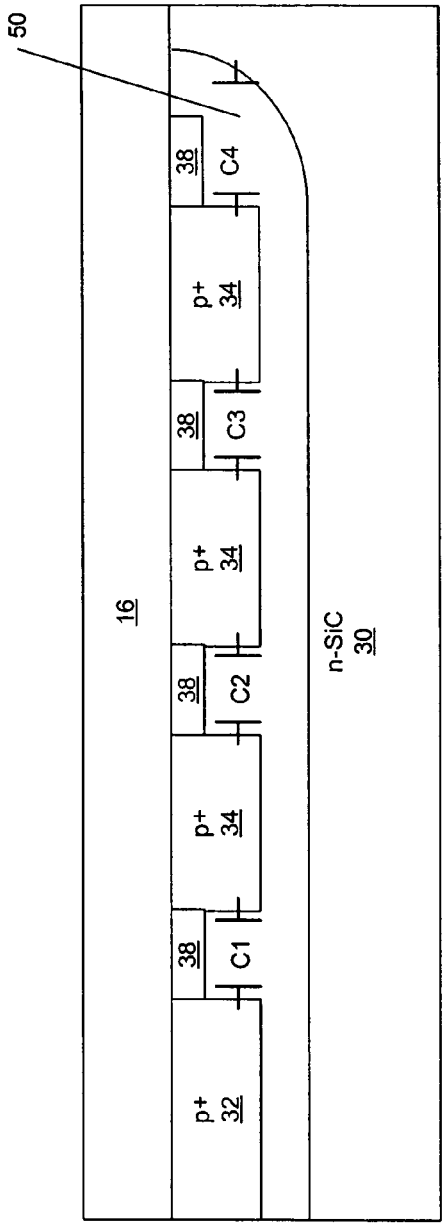
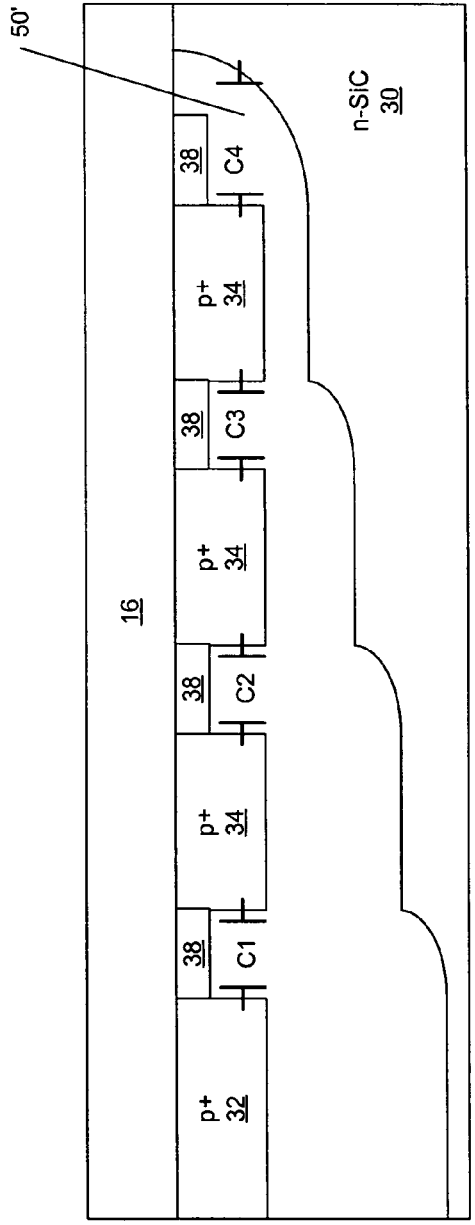
Figure 5A
Figure 5B

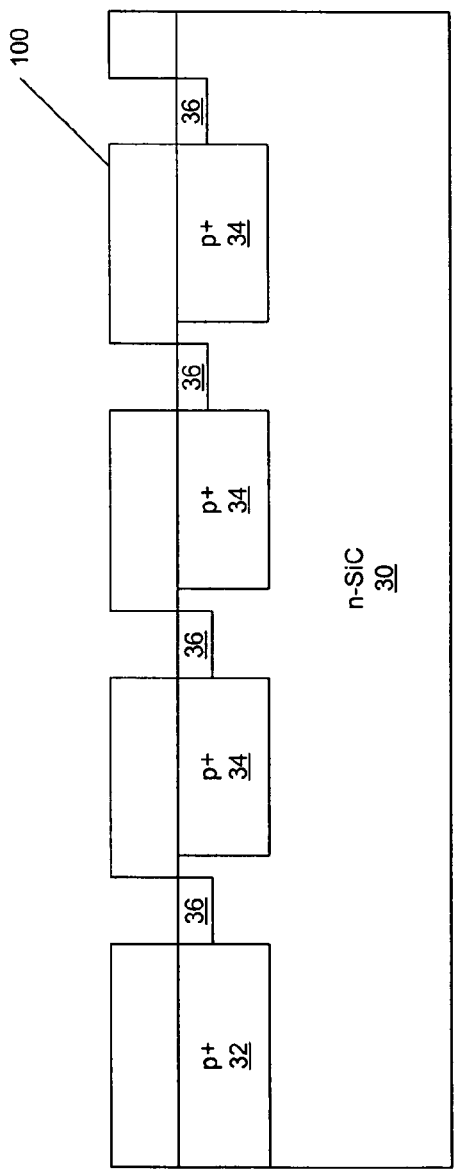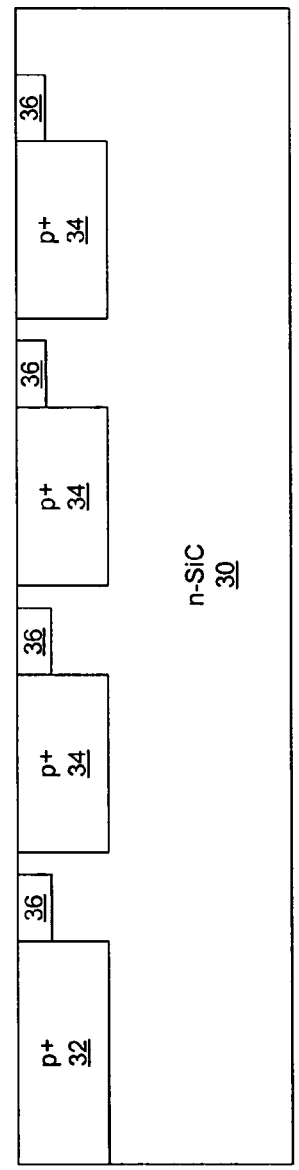
Figure 6C
Figure 6D

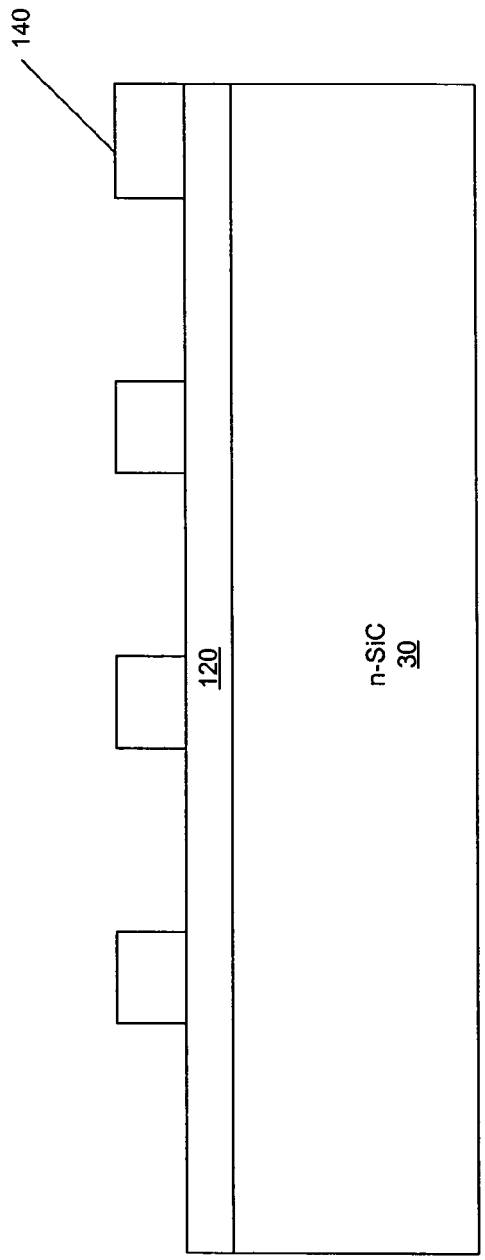
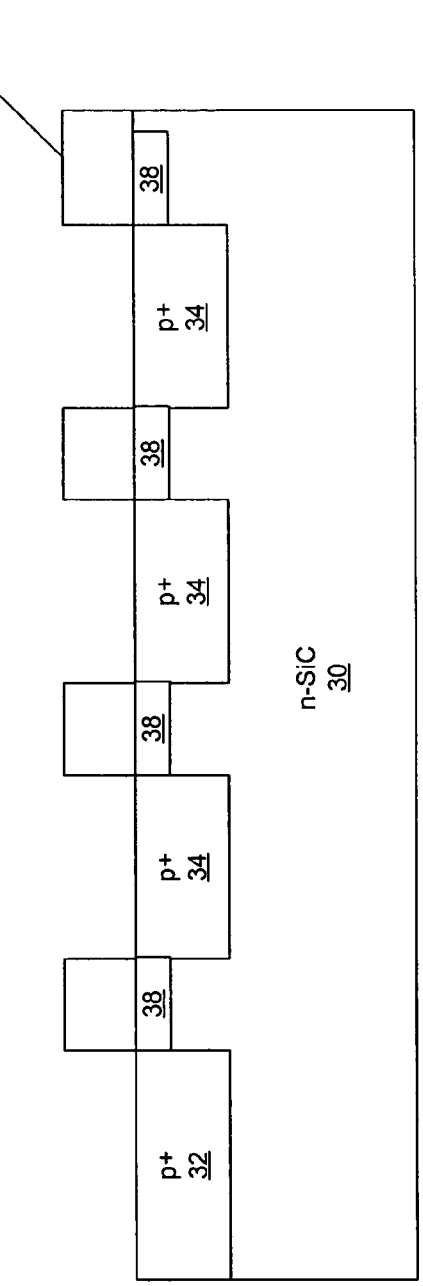

EDGE TERMINATION STRUCTURES FOR SILICON CARBIDE DEVICES

CLAIM OF PRIORITY AND CROSS REFERENCE TO RELATED APPLICATIONS

The present application is a continuation in part of U.S. patent application Ser. No. 11/268,789, entitled "MULTIPLE FLOATING GUARD RING EDGE TERMINATION FOR SILICON CARBIDE DEVICES AND METHODS OF FABRICATING SILICON CARBIDE DEVICES INCORPORATING SAME," and filed Nov. 8, 2005 now U.S Pat. No. 7,419,877, which is a divisional application of U.S. patent application Ser. No. 10/731,860, filed Dec. 9, 2003 now U.S. Pat. No. 7,026,650, which claims priority from U.S. Provisional Patent Application Ser. No. 60/440,193, entitled "MULTIPLE FLOATING GUARD RING EDGE TERMINATION FOR SILICON CARBIDE DEVICES AND METHODS OF FABRICATING SILICON CARBIDE DEVICES INCORPORATING SAME," and filed Jan. 15, 2003, the disclosures of which are incorporated herein by reference as if set forth fully.

FIELD OF THE INVENTION

The present invention relates microelectronic devices, and more particularly to edge termination for silicon carbide devices.

BACKGROUND OF THE INVENTION

High voltage silicon carbide (SiC) Schottky diodes, which can handle voltages between, for example, about 600V and about 2.5 kV, are expected to compete with silicon PIN diodes fabricated with similar voltage ratings. Such diodes may handle as much as about 100 amps or more of current, depending on their active area. High voltage Schottky diodes have a number of important applications, particularly in the field of power conditioning, distribution and control.

An important characteristic of a SiC Schottky diode in such applications is its switching speed. Silicon-based PIN devices typically exhibit relatively poor switching speeds. A silicon PIN diode may have a maximum switching speed of approximately 20 kHz, depending on its voltage rating. In contrast, silicon carbide-based devices are theoretically capable of much higher switching speeds, for example, in excess of about 100 times better than silicon. In addition, silicon carbide devices may be capable of handling a higher current density than silicon devices.

A conventional SiC Schottky diode structure has an n-type SiC substrate on which an n-epitaxial layer, which functions as a drift region, is formed. The device typically includes a Schottky contact formed directly on the n-layer. Surrounding the Schottky contact is a p-type JTE (junction termination extension) region that is typically formed by ion implantation. The implants may be aluminum, boron, or any other suitable p-type dopant. The purpose of the JTE region is to reduce or prevent the electric field crowding at the edges, and to reduce or prevent the depletion region from interacting with the surface of the device. Surface effects may cause the depletion region to spread unevenly, which may adversely affect the breakdown voltage of the device. Other termination techniques include guard rings and floating field rings that may be more strongly influenced by surface effects. A channel stop region may also be formed by implantation of n-type dopants such as Nitrogen or Phosphorus in order to prevent the depletion region from extending to the edge of the device.

Additional conventional terminations of SiC Schottky diodes are described in "Planar Terminations in 4H—SiC Schottky Diodes With Low Leakage And High Yields" by Singh et al., ISPSD '97, pp. 157-160. A p-type epitaxy guard ring termination for a SiC Schottky Barrier Diode is described in "The Guard-Ring Termination for High-Voltage SiC Schottky Barrier Diodes" by Ueno et al., IEEE Electron Device Letters, Vol. 16, No. 7, July, 1995, pp. 331-332. Additionally, other termination techniques are described in published PCT Application No. WO 97/08754 entitled "SiC Semiconductor Device Comprising A PN Junction With A Voltage Absorbing Edge."

As briefly discussed above, Junction termination extension (JTE), multiple floating guard rings (MFGR) and field plates (FP) are commonly used termination schemes in high voltage silicon carbide devices. JTE may be very effective edge termination, however JTE may also require tight control of the product of the active doping concentration and junction depth. Furthermore, additional fabrication costs may be incurred as a result of added photolithography and implantation steps.

FP is also a conventional technique for edge termination of a device and may be cost-effective. In conventional FP devices, high fields are supported by the oxide layer under the metal field plate. This technique performs well for silicon devices where the highest field in the semiconductor is relatively low. However, in SiC devices the electric fields in the blocking state may be very high (~2 MV/cm) which multiplies by a factor of 2.5 at the oxide-semiconductor interface. This leads to very high oxide fields and may result in long-term reliability problems. Thus, FP may be unsuitable for use in SiC devices.

Multiple floating guard rings in addition to JTE has been proposed as a technique for reducing the sensitivity of the JTE to implant dose variation. See Kinoshita et al., "Guard Ring Assisted RESURF: A New Termination Structure Providing Stable and High Breakdown Voltage for SiC Power Devices," Tech. Digest of ISPSD '02, pp. 253-256. Kinoshita et al. reported that such techniques reduced the sensitivity to implant dose variation. However, the area utilized for termination was increased to almost three times the area of JTE alone as the guard rings are added to both the inner edge of the JTE and the outside of the JTE.

MFGR may also be a cost-effective method of edge termination because it may use fewer fabrication steps than JTE. However, MFGR may be very sensitive to surface charges in the oxide-semiconductor interface. The ideal electric field profile of an ideal Multiple Floating Guard Rings (MFGR) termination is shown in FIGS. 1A through 1D. FIG. 1A illustrates a conventional MFGR device where the spacing between the p-type SiC guard rings is illustrated as constant for simplicity. At the blocking state, the depletion region starts at the main junction and expands both laterally and vertically. Once the depletion region punches through to the first guard ring, the potential of the first guard ring gets pinned to that of the main junction. At this point, the punch-through side of the guard ring injects a small amount of holes into the n-region. This lost charge is replaced by the depletion of the n charge from the outer edge of the guard ring. This punch-through and charge injection continues on until the depletion region reaches the final guard ring. Since the amounts of n-charge depleted between the guard rings are the same (constant spacing MFGR's), the peak x-field each guard ring sees is the same for all guard rings, as shown in FIG. 1B. However, as seen in FIG. 1C, the peak y-field is different for all guard rings because the amount of n-charge depletion is different for all guard rings. The highest y-field value is present at the main junction and successive guard rings have reduced levels of y-field. The vector sum of the x and the y fields is illustrated in FIG. 1D, and shows the highest electric field at the bottom corner of the main junction (circled in FIG. 1A). Therefore, breakdown is expected to happen at the circled bottom edge of the main junction if equally spaced MFGR termination is used. If it is desired that each floating guard ring supports the same electric fields, the spacing between the guard rings may vary. The spacing between the main junction and the inner-most guard ring may be the smallest, and the spacing at the outer-most guarding may be the largest.

One potentially critical issue with the MFGR termination scheme is that it is very sensitive to the charge at the oxide-semiconductor interface. The net charge at metal-oxide-semiconductor (MOS) gate regions of MOS transistors can be very low. However, field oxides often typically have lower quality when compared to thermally grown gate oxides and plasma processing steps may result in higher oxide charges. When a large amount of positive charge is present at the oxide-semiconductor interface, the surface of the lightly doped n-layer turns into n+ regions, which compresses the equi-potential lines. This results in very high field at the oxide-semiconductor interface and, therefore, reduces the effectiveness of the floating guard rings that may result in a reduction of blocking voltage for the devices. In addition, this charge, mostly positive, can move towards or away from the oxide-semiconductor interface, causing time dependent breakdown voltage, or breakdown walk-out. Breakdown walk-out refers to a phenomenon where the breakdown voltage starts at a first value and increases with time and bias. This problem may be even greater in silicon carbide devices because the field oxides are generally deposited. Deposited oxides, typically, have inferior characteristics to those of thermally grown layers, and the oxide-semiconductor interface in a silicon carbide device has much greater charge density compared to that of a silicon device.

Putting Offset Field Plates on each guard ring was suggested in Yilmaz, "Optimization and Surface Charge Sensitivity of High Voltage Blocking Structures with Shallow Junctions," IEEE Transactions on Electron Devices, Vol. 38, No. 3, July 1991, pp. 1666-1675. Such a structure is illustrated in FIG. 2. As seen in FIG. 2, an n-type semiconductor layer 10 has a main junction 12 and a series of floating guard rings 14 formed therein. An oxide layer 16 is provided on the semiconductor layer 10 and openings are provided in the oxide layer 16. The offset field plates 18 are provided in the openings to contact the floating guard rings 14 and to extend onto the oxide layer 16.

Yilmaz demonstrated that the voltage that each guard ring supports can be distributed evenly and the sensitivity to parasitic charges can be reduced by spreading the equipotential lines near the interface. This technique can be implemented in silicon devices relatively easily because the doping densities of the drift layer in silicon devices are generally low, and guard rings can have reasonably large spacing between them. However, in silicon carbide devices, the doping densities in the drift layer can be up to 100 times or more than that of a silicon device with the same blocking capability and the electric field each guard ring supports may be up to 10 times or more greater than that of a silicon device. Therefore, the guard rings may need to be placed much closer to each other compared to a silicon device, and the field oxide thickness that may be needed may be much thicker than that used in silicon devices. Such requirements may be difficult to achieve with conventional fabrication techniques, such as photolithography, for silicon carbide devices because the Offset Field Plate-Floating Guard Ring structure has each field plate contacting each guard ring separately and the edge of the guard ring should not overlap with the edge of the next guard ring. To meet these requirements, each guard ring may need to be enlarged, and the alignment tolerance of the guard rings should be less than 0.25 µm. Such alignment requirements may be difficult, if not impossible, to achieve with conventional contact aligners for SiC. Step coverage may also be another issue with the Offset Field Plate-Floating Guard Ring structure because the thickness of the oxide that may be needed. Additionally, in field plate designs the quality of the oxide may be important in achieving acceptable results as it is the oxide that supports the field or voltages. Oxides in silicon carbide devices, generally have lower quality than that available in silicon devices. Accordingly, the Offset Field Plate-Floating Guard Ring structure may not be practical for silicon carbide devices.

Conventional guard-ring based SiC Schottky devices may further suffer from anodic oxidation of the surface of the silicon carbide, which may be associated with significant current flow through the guard rings in the reverse blocking state. In an anodic oxidation process, oxygen contained in polyimide passivation layers on the silicon carbide surface may react with the silicon carbide substrate in the presence of electric current caused by high electric fields to form silicon oxide. Anodic oxidation of the silicon carbide surface may result in a poor quality oxide layer on the silicon carbide surface, which may reduce the effectiveness of the edge termination.

SUMMARY OF THE INVENTION

Some embodiments of the present invention provide an edge termination structure for a silicon carbide semiconductor device including a plurality of spaced apart concentric floating guard rings in a silicon carbide layer that at least partially surround a silicon carbide-based junction, an insulating layer on the floating guard rings, and a silicon carbide surface charge compensation region between the floating guard rings and adjacent the insulating layer. A silicon nitride layer is on the silicon carbide layer, and an organic protective layer is on the silicon nitride layer.

The edge termination structure may further include an oxide layer between the silicon carbide layer and the silicon nitride layer. The silicon nitride layer has a thickness of from about 500 Å to about 1 µm.

The organic protective layer may include polyimide, and may have a higher moisture content than the silicon nitride layer.

The floating guard rings may extend a first distance into the silicon carbide layer and the surface charge compensation region may extend a second distance into the silicon carbide layer, the second distance being less than the first distance. The surface charge compensation region may be lighter doped than the guard rings.

In some embodiments, the surface charge compensation region may extend completely between adjacent ones of the floating guard rings. In other embodiments, the surface charge compensation region may extend between adjacent ones of the floating guard rings but may not extend completely between two adjacent floating guard rings.

The surface charge compensation region may include a second silicon carbide layer on the silicon carbide layer. The surface charge compensation region may have a dopant concentration such that the surface of the surface charge compensation region adjacent the oxide layer may be partially depleted by surface charges of the oxide layer and fully depleted when a reverse bias may be applied to the device.

The surface charge compensation region may have a dose charge of from about $1 \times 10^{12}$ to about $7 \times 10^{12}$ cm$^{-2}$.

An edge termination structure for a silicon carbide semiconductor device according to further embodiments of the invention includes a plurality of spaced apart concentric floating guard rings in a silicon carbide layer that at least partially surround a silicon carbide-based junction, an insulating layer on the floating guard rings, and a silicon carbide surface charge compensation region between the floating guard rings and adjacent the insulating layer. The insulating layer may include a moisture barrier on the silicon carbide layer and an environmental protection layer on the moisture barrier.

The edge termination structure may further include a surface passivation layer between the silicon carbide layer and the moisture barrier layer. The surface passivation layer may include an oxide, such as a thermal oxide. The moisture barrier may include silicon nitride. The environmental protection layer may include polyimide.

An edge termination structure for a silicon carbide semiconductor device according to yet further embodiments of the invention includes a plurality of spaced apart concentric floating guard rings in a silicon carbide layer that at least partially surround a silicon carbide-based junction, a protective layer on the surface of the silicon carbide layer, and a silicon carbide surface charge compensation region between the floating guard rings and on the surface of the silicon carbide layer. The silicon carbide semiconductor device includes a surface that exhibits substantially no anodic oxidation when the device is exposed to a reverse bias voltage cycled between 0 and 600V at 10 kHz in $N_2$ for 350 hours followed by air for 168 hours.

A method of fabricating an edge termination structure for a silicon carbide semiconductor device according to some embodiments of the invention includes forming a plurality of spaced apart concentric floating guard rings in a surface of a silicon carbide layer, the floating guard rings surrounding at least a portion of a silicon carbide-based semiconductor junction, forming a silicon carbide surface charge compensation region between the floating guard rings at the surface of the silicon carbide layer, forming a silicon nitride layer on the surface of the silicon carbide layer, and forming an organic protective layer on the silicon nitride layer.

The method may further include forming an oxide layer between the silicon carbide layer and the silicon nitride layer. The silicon nitride layer may have a thickness of from about 500 Å to about 1 µm. The organic protective layer may include polyimide.

Advantages and/or features of the invention, and the manner in which the same are accomplished, will become more readily apparent upon consideration of the following detailed description of the invention taken in conjunction with the accompanying drawings, which illustrate preferred and exemplary embodiments, and wherein:

DESCRIPTION OF THE DRAWINGS

FIGS. 5A and 5B are cross sections illustrating possible operation of an edge termination structure according to embodiments of the present invention;

FIGS. 6A through 6J are cross sections illustrating methods of fabricating edge termination structures according to embodiments of the present invention;

DETAILED DESCRIPTION

Figure 1A:
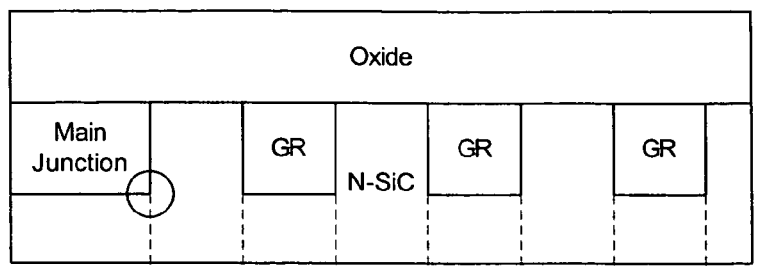
FIGS. 1A-D are diagrams of a conventional MFGR structure and the ideal field profile of that structure.
Figure 1B:
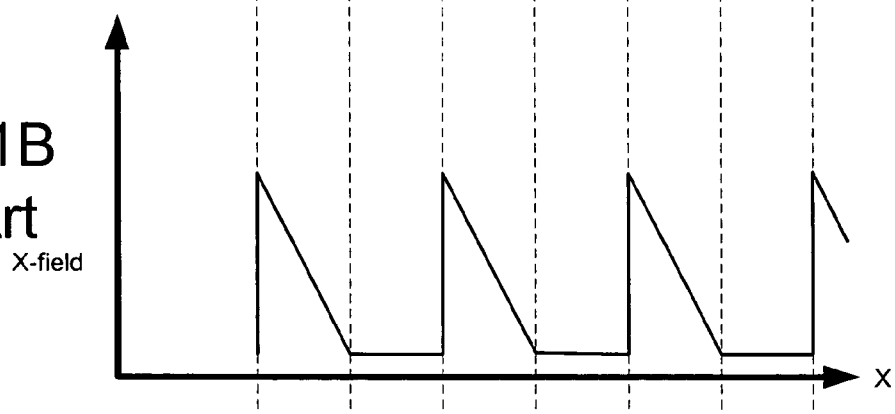
Figure 1C:
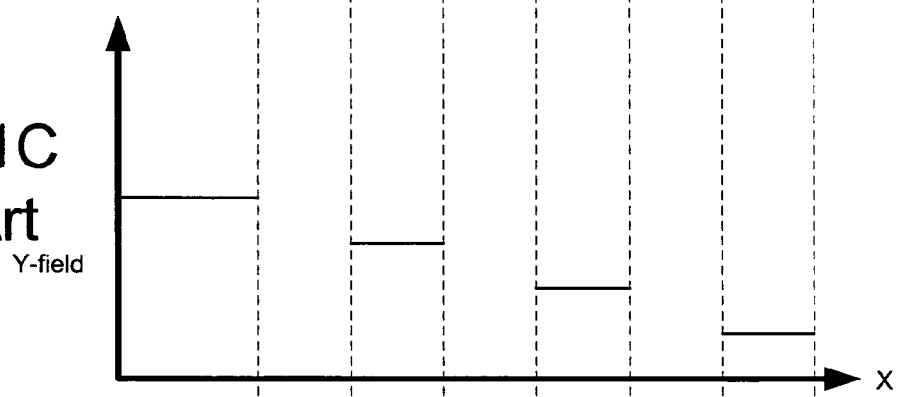
Figure 1D:
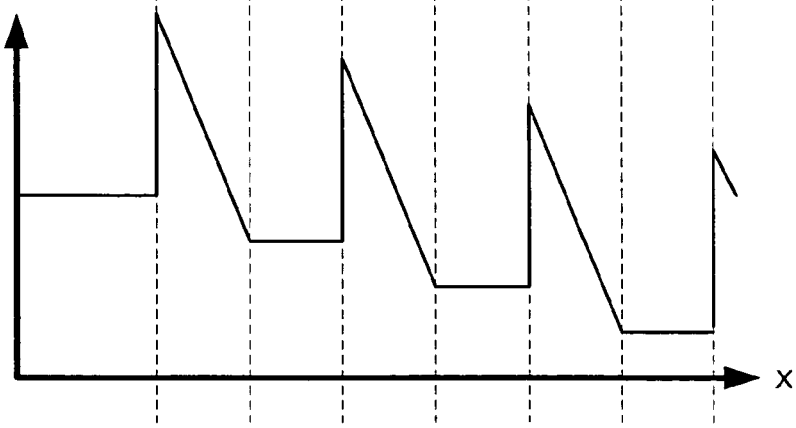
Figure 2:
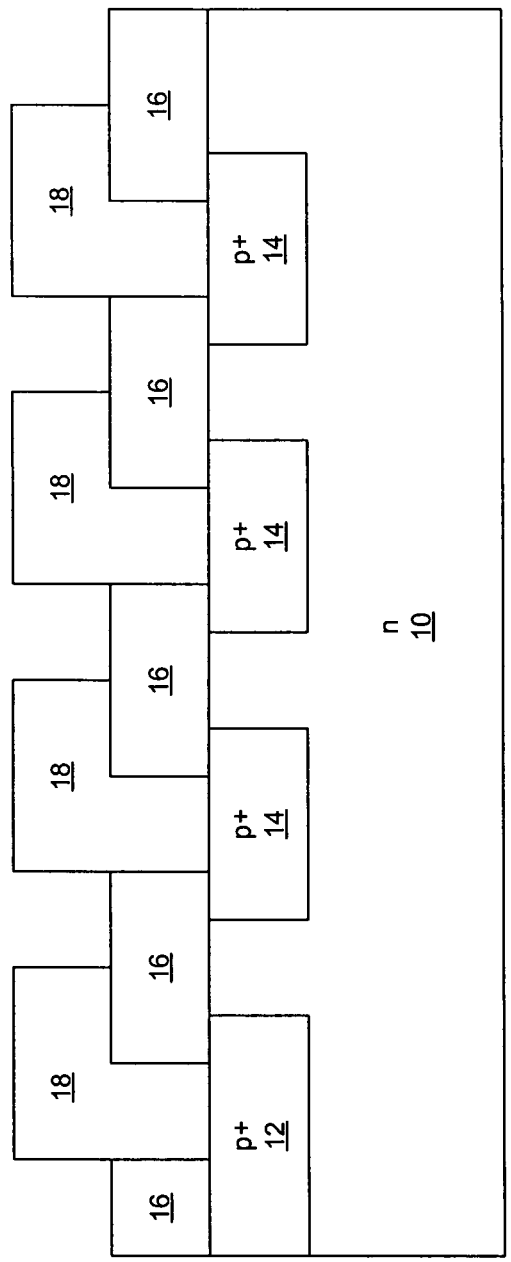
FIG. 2 is a diagram of an MFGR structure with offset field plates.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

As illustrated in the Figures, the sizes of layers or regions are exaggerated for illustrative purposes and, thus, are provided to illustrate the general structures or the present invention. Furthermore, various aspects of the present invention are described with reference to a layer being formed on a substrate or other layer. As will be appreciated by those of skill in the art, references to a layer being formed on another layer or substrate contemplates that additional layers may intervene. References to a layer being formed on another layer or substrate without an intervening layer are described herein as being formed "directly" on the layer or substrate.

As is described in more detail below, embodiments of the present invention may provide improved edge termination of semiconductor devices, such as P-N, Schottky, PiN or other such semiconductor devices. Particular embodiments of the present invention provide edge termination for silicon carbide (SiC) devices. For example, embodiments of the present invention may be utilized as edge termination for SiC Schottky diodes, junction barrier Schottky (JBS) diodes, PiN diodes, thyristors, transistors, or other such SiC devices. Embodiments of the present invention may reduce the sensitivity of a multiple floating guard ring termination to oxide-semiconductor surface charges. In particular embodiments, a surface charge compensation layer, such as a thin p-type layer, is provided in addition to the multiple floating guard rings. The surface charge compensation layer is used to at least partially neutralize the effects of charges at oxide-semiconductor interfaces in the silicon carbide devices.

Figure 3:
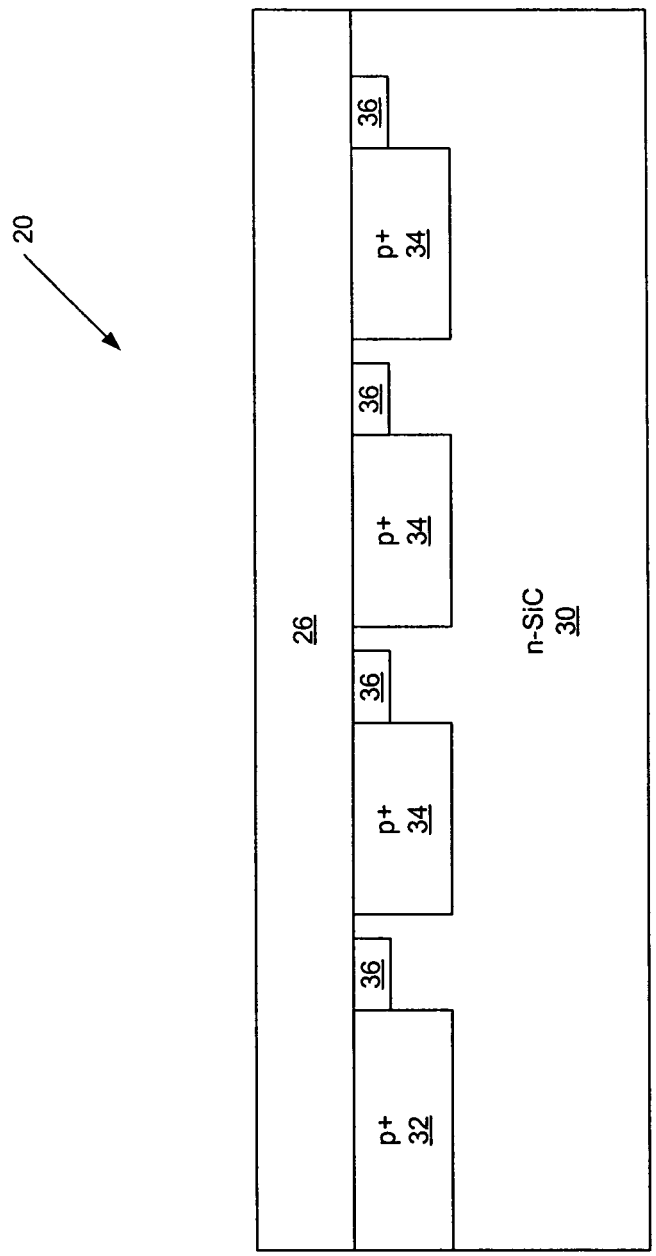
FIG. 3 is a cross section of an edge termination structure according to embodiments of the present invention.

FIG. 3 is a cross section of a silicon carbide semiconductor device 20 illustrating particular embodiments of the present invention. As illustrated in FIG. 3, a silicon carbide layer 30, such as a lightly doped n-type silicon carbide layer, has formed therein a main junction 32, for example, of p-type silicon carbide, and a plurality of floating guard rings 34, such as p-type silicon carbide floating guard rings. The silicon carbide layer 30 may be grown on an n+ 4H—SiC substrate. An insulating layer 26, such as an oxide layer, is provided on the silicon carbide layer 30. The insulating layer 26 may be a deposited or grown oxide and may be fabricated utilizing techniques known to those of skill in the art. In particular embodiments of the present invention, the insulating layer 26 may be an oxide, such as $SiO_2$, a nitride, such as $Si_3N_4$, an oxide-nitride-oxide structure and/or an oxynitride or organic films such as a polyimide layer.

As is further illustrated in FIG. 3, thin regions of silicon carbide, such as p-type silicon carbide, are provided between the spaced apart floating guard rings 34 to spread the equipotential lines to reduce the surface field and thus provide surface charge compensation regions or layers 36. As seen in FIG. 3, respective ones of the surface charge compensation regions 36 may be adjacent and contacting a first of two adjacent guard rings 34 and extend from the first guard ring towards the second of the two adjacent guard rings 34. Alternatively, two or more thin regions of silicon carbide could be provided between adjacent ones of the floating guard rings 34 and the two or more thin regions could extend from respective ones of the floating guard rings toward each other. In other embodiments of the present invention, the surface charge compensation regions 36 need not be identical in size, doping, shape or location relative to the adjacent guard rings 34. The surface charge compensation regions 36 may be provided, for example, as a layer of p-type silicon carbide.

For the structure illustrated in FIG. 3 where p-type silicon carbide surface charge compensation regions are provided in an n-type silicon carbide layer, the dose charge (concentration×depth=dose) of the surface charge compensation regions or layers 36 should be from about $1 \times 10^{12}$ to about $1 \times 10^{13}$ cm$^{-2}$. The oxide-semiconductor interface is expected to have from about $1 \times 10^{12}$ to about $2 \times 10^{12}$ cm$^{-2}$ of positive charge. The surface of the surface charge compensation regions 36 will, typically, be depleted by the positive surface charges, and the negative charges in the depletion region in the surface charge compensation regions 36 will terminate the E-field lines originating from the oxide interface charges, and neutralize the negative effects of the positive interface charges. Furthermore, the amount of charge in the surface charge compensation regions 36 is small enough so that these regions can be completely depleted at a lower voltage (lower than the blocking voltage of the device), which may be required for guard rings to function properly. Therefore, surface charge compensation regions 36 may make the multiple floating guard ring termination less sensitive or insensitive to the changes in the oxide charge. Thus, operation of the surface charge compensation regions 36 according to embodiments of the present invention may function very differently from the JTE termination that utilizes the RESURF principle Appels et al., "High-voltage thin layer devices (RESURF devices)," IEDM Tech. Dig., 1979, pp. 238-241, because the function the surface charge compensation regions 36 described herein is to compensate for the oxide charges, whereas the p-layer in a conventional JTE is used to terminate the charge in the depletion region of the drift layer vertically, so that the lateral field may be reduced and/or minimized.

Figure 4:
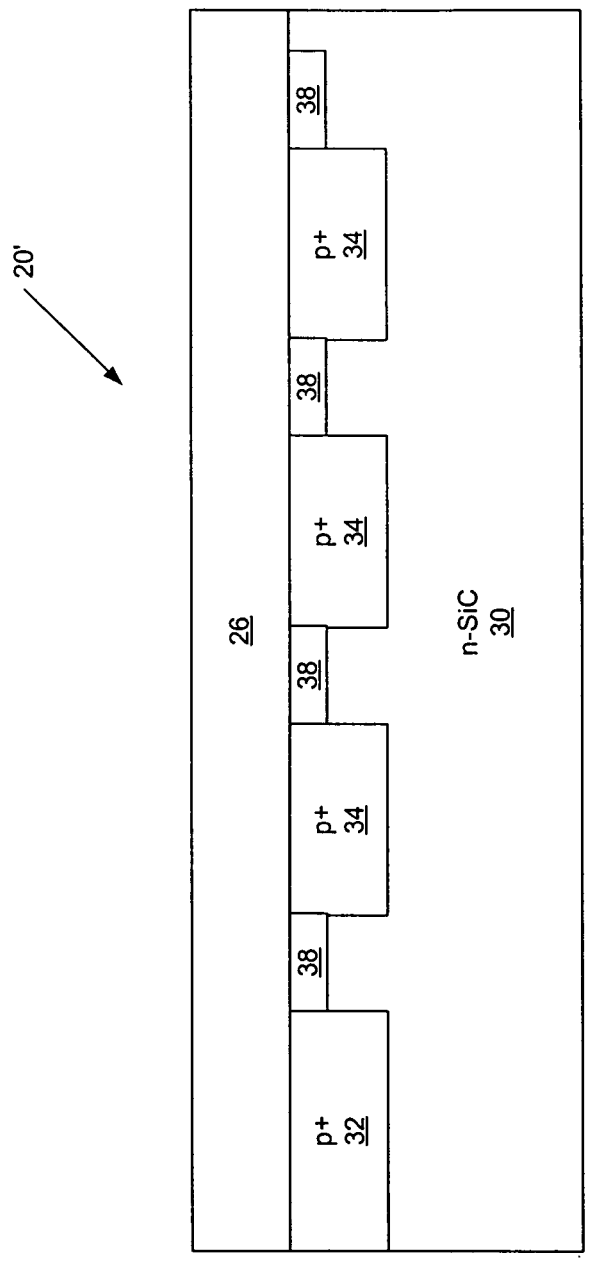
FIG. 4 is a cross section of an edge termination structure according to further embodiments of the present invention.

While the structure illustrated in FIG. 3 may be effective at compensating for oxide charges, the small spacing between the floating guard rings that are provided in silicon carbide devices may make fabrication of such devices difficult because of the tight alignment tolerances that may be needed for photolithography. Therefore, in silicon carbide devices, it may be more practical to merge all surface-charge compensating p-layers into one pattern, connecting all guard rings as shown in FIG. 4. Thus, as illustrated in FIG. 4, a silicon carbide device 20' is provided having a surface charge compensation layer 38 that is provided between adjacent ones of the floating guard rings 34. In the device 20' the charge compensating layer 38 is illustrated as a p-type silicon carbide layer. This p-layer 38 may have the same total charge of from about $1 \times 10^{12}$ to about $1 \times 10^3$ cm$^{-2}$, which is the same as that illustrated in FIG. 3. The charge in the p-layer 38 may neutralize positive oxide charges, and therefore making the device less sensitive to the oxide-semiconductor interface charges.

The surface charge compensation regions/layer 36, 38 may, in some embodiments, have a thickness of from about 0.1 µm to about 2 µm. Furthermore, in embodiments of the present invention where the surface charge compensation regions 36 do not connect adjacent floating guard rings, a gap of from about 0.1 µm to about 2 µm may be provided.

In particular embodiments of the present invention, the floating guard rings 34 may be uniformly spaced, non-uniformly spaced or combinations of uniformly and non-uniformly spaced. Furthermore, the guard rings 34 may extend from about 0.1 µm to about 2 µm into the silicon carbide layer. In some cases, the guard rings 34 may extend from about 0.1 µm to about 1 µm into the silicon carbide layer. The guard rings 34 may have a spacing of from about 0.1 µm to about 10 µm. Additionally, in certain embodiments of the present invention, from about 1 to about 100 guard rings 34 may be provided. The guard rings may 34 extend a distance of from about 2 µm to about 1 mm from the main junction of the device. The floating guard rings 34 may have a dopant concentration of from about $1 \times 10^{18}$ cm$^{-3}$ to about $1 \times 10^{20}$ cm$^{-3}$. In some embodiments, the floating guard rings 34 may have a dopant concentration of from about $1 \times 10^{19}$ cm$^{-3}$ to about $1 \times 10^{20}$ cm$^{-3}$.

In fabricating devices according to certain embodiments of the present invention, the p-layer 38 or p-type regions 36 may be formed before or after formation of the guard rings 34. Such regions 36 or layer 38 may be provided by, for example, ion implantation, or other techniques known to those of skill in the art. Alternatively, the p-layer and/or p-regions may be an epitaxially grown layer of SiC or deposited layer of SiC that is formed on the layer 30 and, in the case of the regions, patterned to provide the desired surface charge compensation regions and/or layers. In such case, the guard rings may be formed prior to formation of the SiC layer or after formation of the SiC layer. Implanted p-type dopants may be activated by annealing at a temperature of 1300° C. or greater.

The operation of the termination according to certain embodiments of the present invention is illustrated in FIGS. 5A and 5B. When a small reverse bias is applied, the neutral part of the surface charge compensation layer (SCCL) 38 (i.e., the portion of the layer 38 that has not been depleted by the oxide charge) starts being depleted and provides the depletion region 50 as illustrated in FIG. 5A. Because the SCCL 38 is not totally depleted, all guard rings are electrically connected at this point, and the portion of the SCCL 38 that extends out of the outer-most guard ring prevents premature breakdown by spreading the depletion region, as shown in FIG. 5A. With application of a higher reverse bias, the SCCL 38 becomes fully depleted, and the guard rings become electrically isolated. However, the guard rings are still coupled to each other by the capacitances (see C1, C2, C3 and C4 illustrated in FIG. 5A). The voltage applied to the device is divided according to the capacitances between the guard rings.

For example, if in FIG. 5A, V1 is the voltage between the main junction 32 and the first guard ring 34, V2 is the voltage between the first guard ring 34 and the second guard ring 34, V3 is the voltage between the second guard ring and the third guard ring and V4 is the voltage between the third guard ring and the n-layer 30, then V1=((1/C1)/(1/C1+1/C2+1/C3+1/C4))*Total Voltage, where the Total Voltage is V1+V2+V3+V4. The potential of each guard ring is determined by this capacitance ratios and applied reverse bias voltage, which then determines the width of the depletion under each guard ring in the vertical direction. The potential of each guard ring increases as it gets closer to the main junction. As a result, the smoothly spread-out depletion region 50' shown in FIG. 5B can be achieved.

While embodiments of the present invention have been illustrated with reference to a P-N main junction, as will be appreciated by those of skill in the art in light of the present disclosure, edge termination techniques according to embodiments of the present invention may be utilized with other devices and/or junction types, such as Schottky junctions.

Figure 6A:
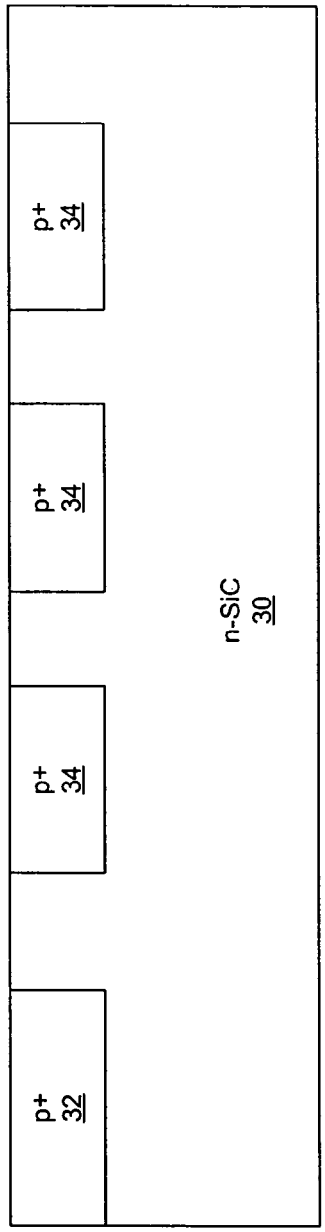

Methods of fabricating junction edge termination structures according to embodiments of the present invention will now be described with reference to FIGS. 6A through 6J. As seen in FIG. 6A, a silicon carbide layer 30 has formed in it a junction 32 and spaced apart concentric floating guard rings 34. Such regions may be formed, for example, by ion implantation into a silicon carbide substrate and/or epitaxial layer.

Figure 6B:
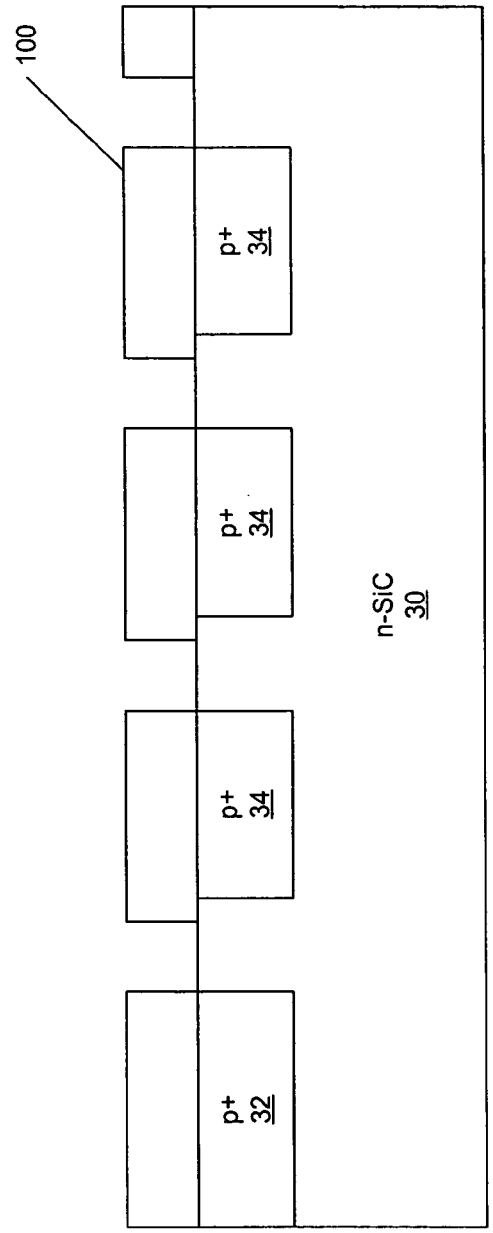

As is seen in FIG. 6B, a mask layer 100 may be formed and patterned on the silicon carbide layer and may correspond to the junction 32 and guard ring 34 regions. The mask layer 100 may be made of conventional mask materials and may, for example, be patterned using conventional photolithography or other such techniques known to those of skill in the art. The mask layer 100 opens windows adjacent the junction 32 and the guard rings 34. The windows may extend partly or completely between adjacent guard rings 34 and/or a guard ring 34 and the junction 32.

Figure 6E:
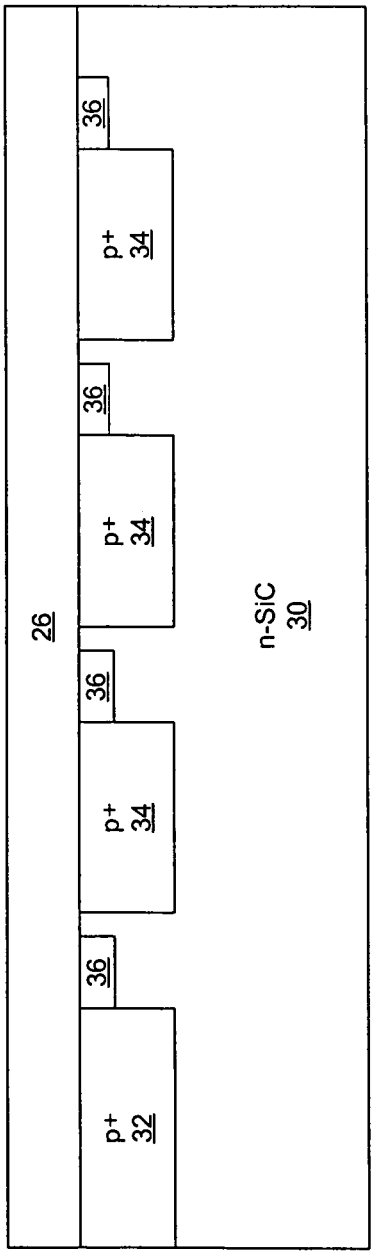

FIG. 6C illustrates the formation of the surface charge compensation regions 36 through ion implantation using the mask layer 100 as an ion implantation mask. The mask layer 100 may then be removed (FIG. 6D) and the insulating layer 26 formed on the resulting structure (FIG. 6E). The insulating layer 26 may, for example, be formed by thermal oxidation and/or depositing an oxide on the resulting structure.

Figure 6F:
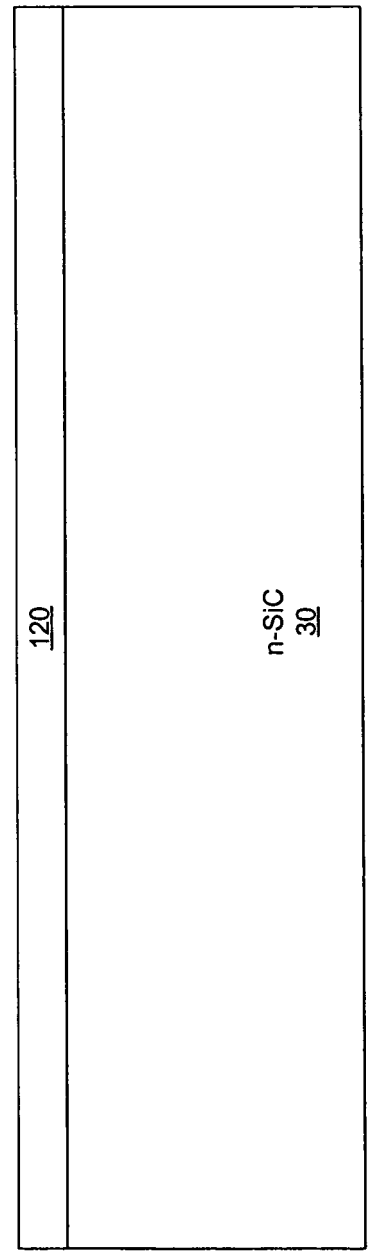
Figure 6I:
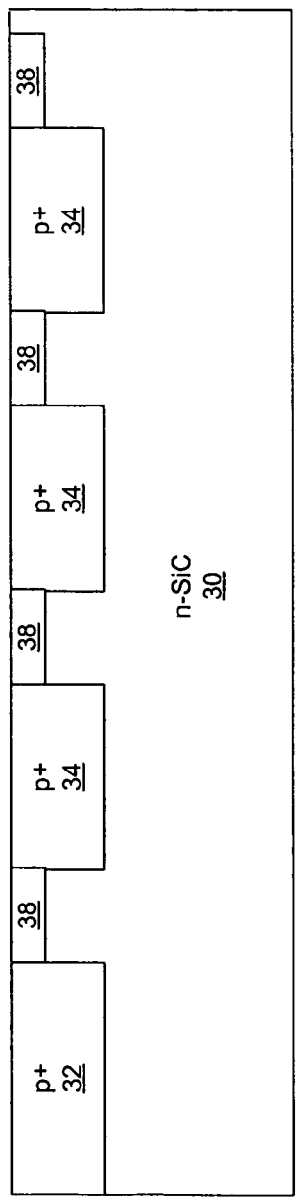

FIG. 6F illustrates methods of fabricating an edge termination structure according to further embodiments of the present invention. As seen in FIG. 6F, a silicon carbide layer 30 has formed on it a thin silicon carbide layer 120. The silicon carbide layer 120 may be an implanted layer and/or an epitaxial layer and may have a thickness and doping level as discussed above with reference to the surface charge compensation regions and/or layer.

Figure 6J:
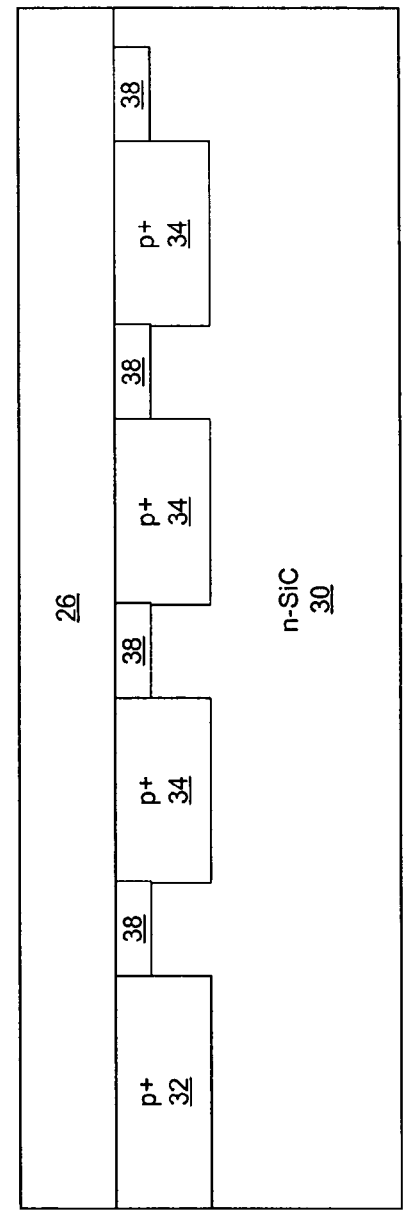
Figure 7A:
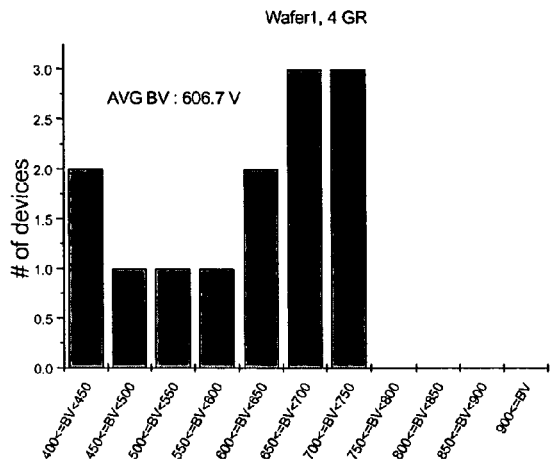
FIGS. 7A, 8A, 9A, 10A, 11A and 12A are distribution plots of breakdown voltages for Schottky devices having a four guard ring termination structure provided on six separate wafers.
Figure 7B:
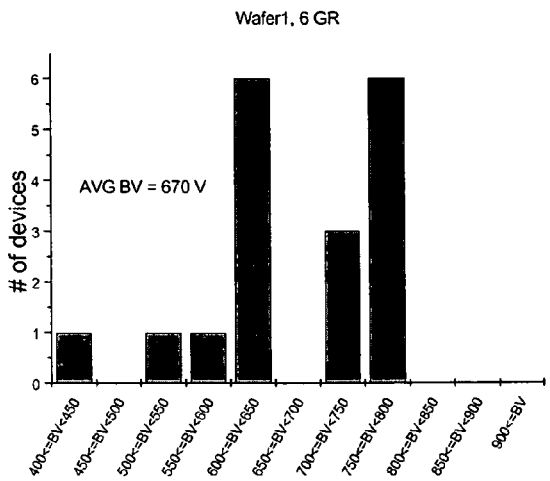
FIGS. 7B, 8B, 9B, 10B, 11B and 12B are distribution plots of breakdown voltages for Schottky devices having a six guard ring termination structure provided on six separate wafers.
Figure 7C:
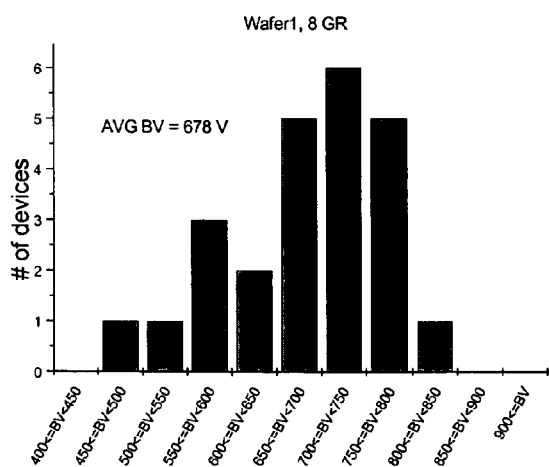
FIGS. 7C, 8C, 9C, 10C, 11C and 12C are distribution plots of breakdown voltages for Schottky devices having an eight guard ring termination structure provided on six separate wafers.
Figure 7D:
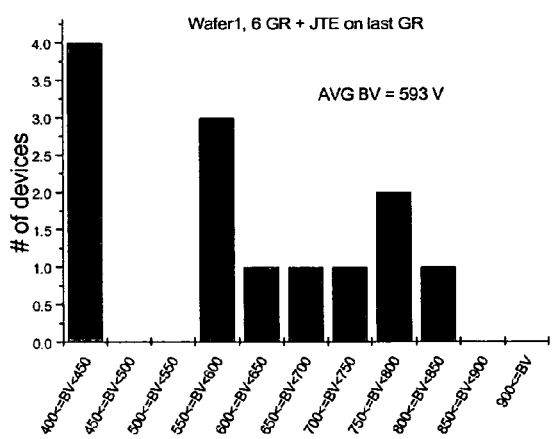
FIGS. 7D, 8D, 9D, 10D, 11D and 12D are distribution plots of breakdown voltages for Schottky devices having an eight guard ring with a JTE at the last guard ring termination structure provided on six separate wafers.
Figure 7E:
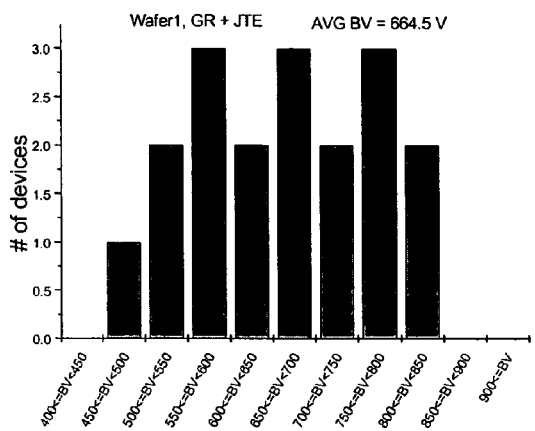
FIGS. 7E, 8E, 9E, 10E, 11E and 12E are distribution plots of breakdown voltages for Schottky devices having a guard ring and JTE termination structure provided on six separate wafers similar to that described in Kinoshita et al., "Guard Ring Assisted RESURF: A New Termination Structure Providing Stable and High Breakdown Voltage for SiC Power Devices," Tech. Digest of ISPSD '02, pp. 253-256 (the Japan Paper)
Figure 7F:
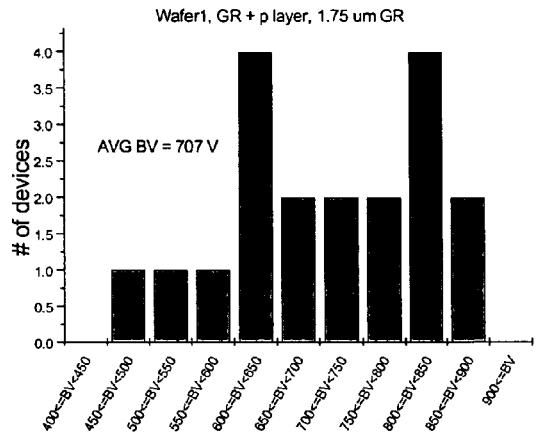
FIGS. 7F, 8F, 9F, 10F, 11F and 12F are distribution plots of breakdown voltages for Schottky devices having a 1.75 µm guard ring with a charge compensation layer termination structure provided on six separate wafers.
Figure 7G:
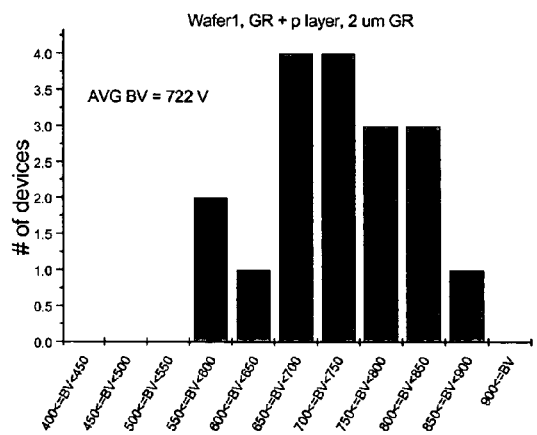
FIGS. 7G, 8G, 9G, 10G, 11G and 12G are distribution plots of breakdown voltages for Schottky devices having a 2.0 µm guard ring with a charge compensation layer termination structure provided on six separate wafers.
Figure 7H:
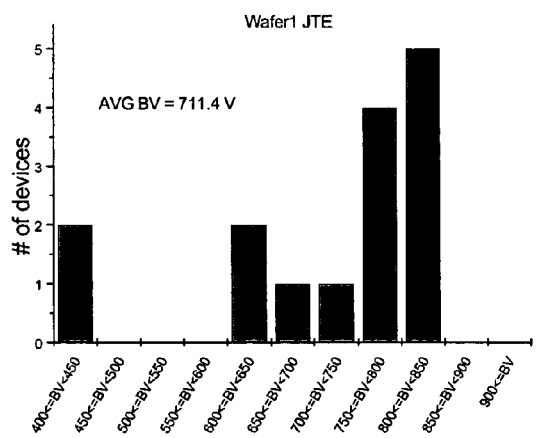
FIGS. 7H, 8H, 9H, 10H, 11H and 12H are distribution plots of breakdown voltages for Schottky devices having a JTE termination structure provided on six separate wafers.
Figure 8A:
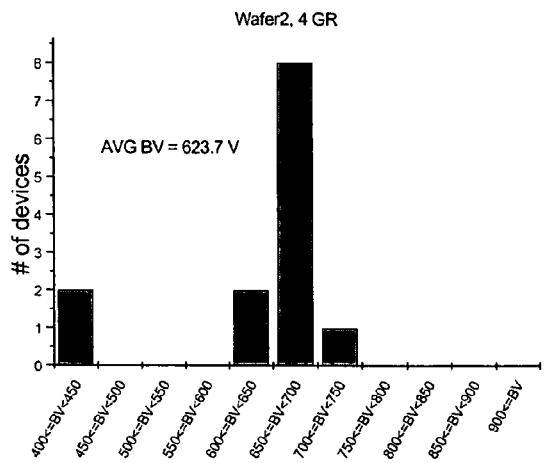
Figure 8B:
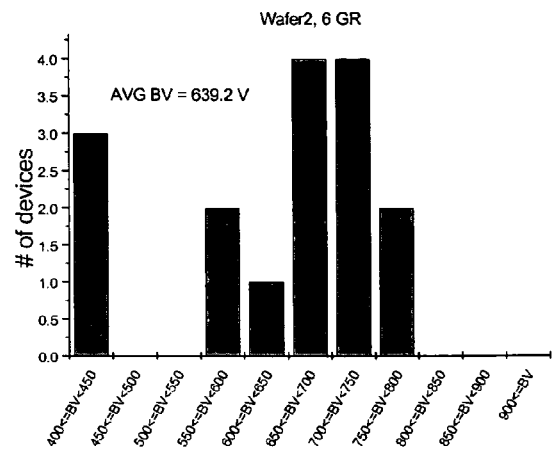
Figure 8C:
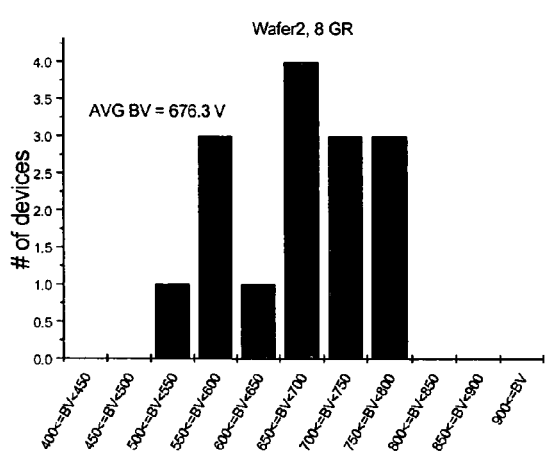
Figure 8D:
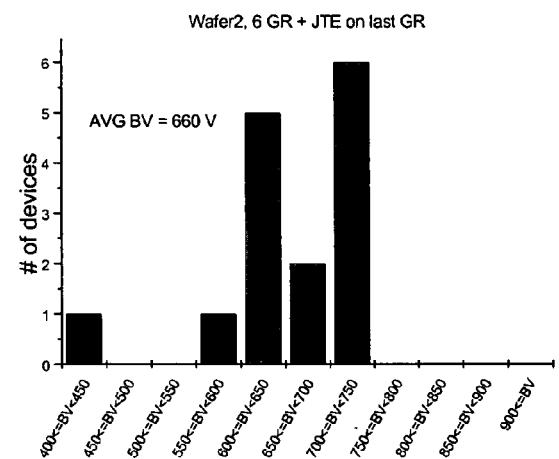
Figure 8E:
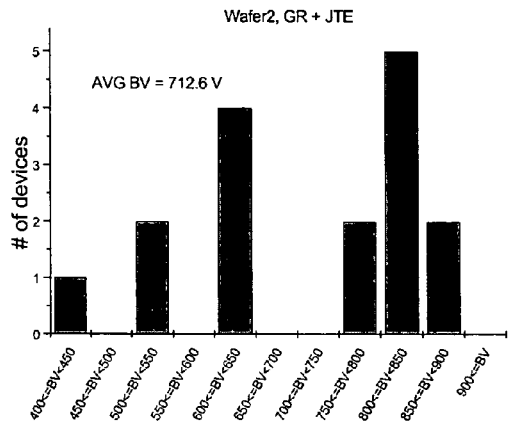
Figure 8F:
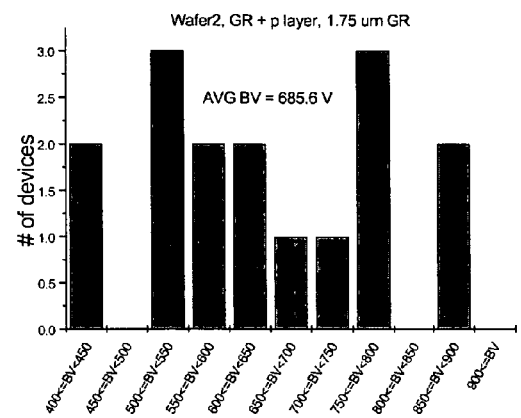
Figure 8G:
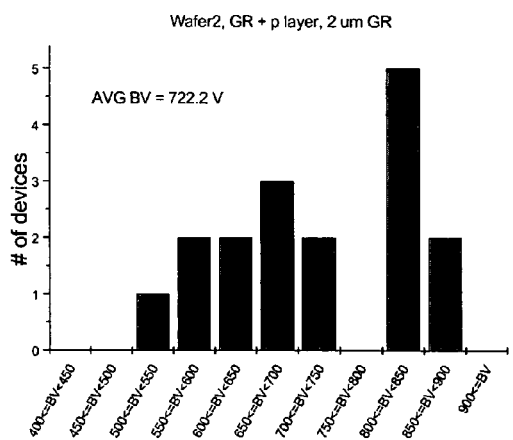
Figure 8H:
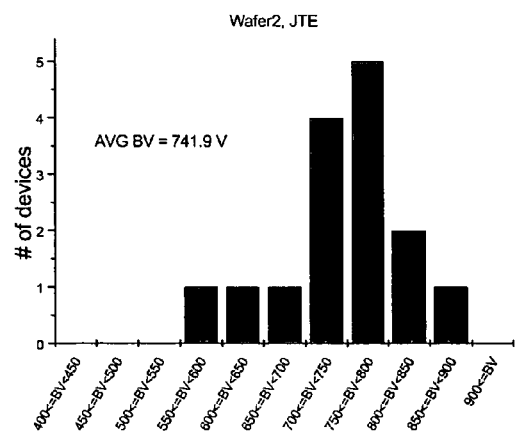
Figure 9A:
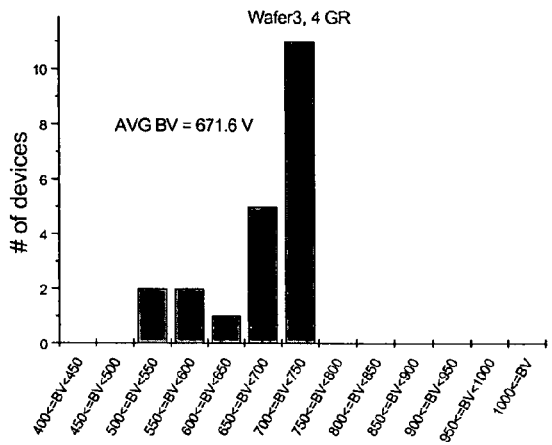
Figure 9B:
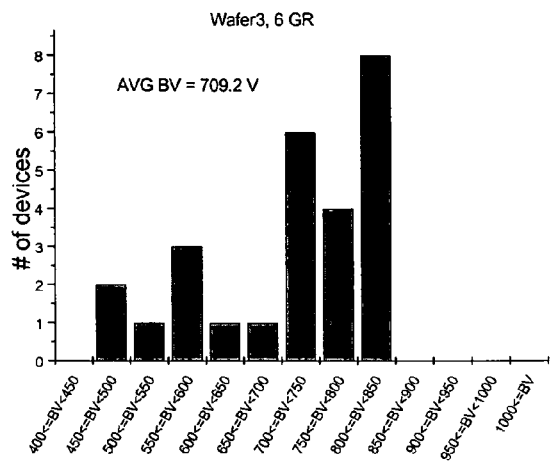
Figure 9C:
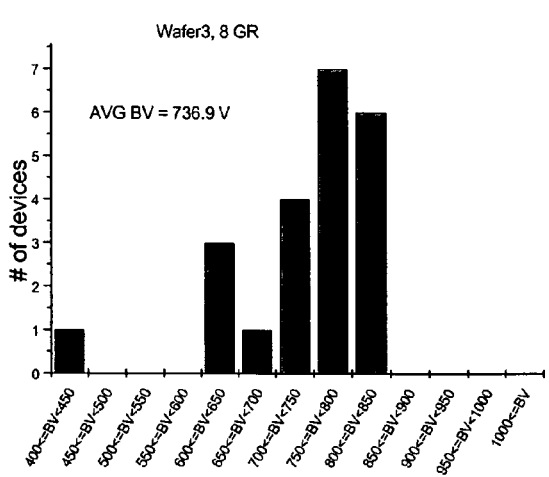
Figure 9D:
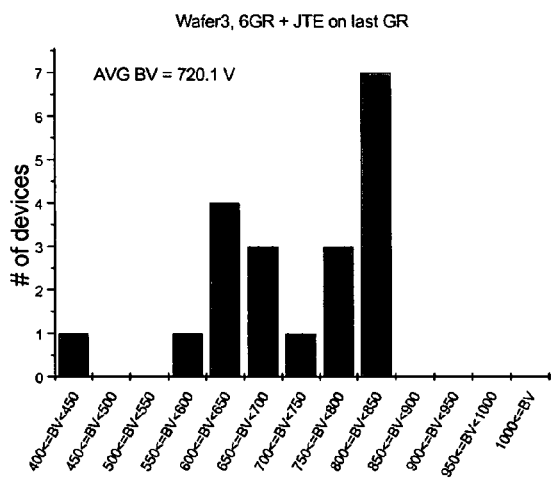
Figure 9E:
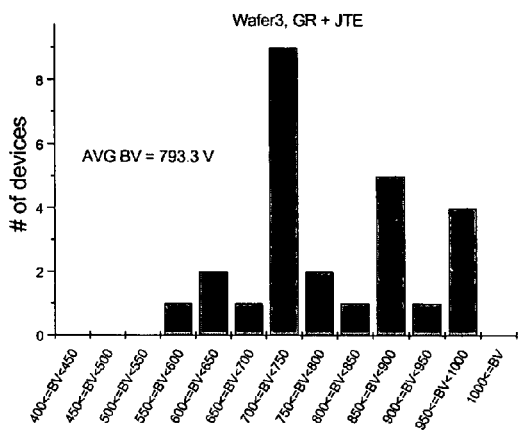
Figure 9F:
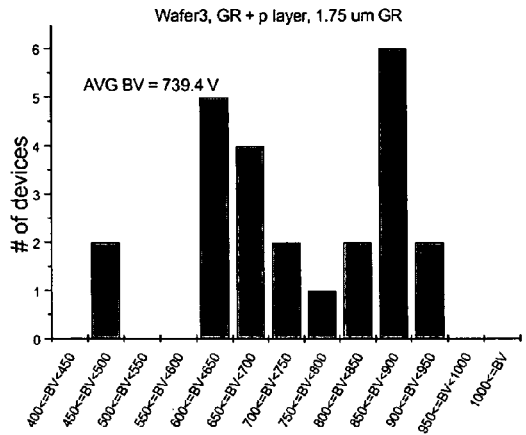
Figure 9G:
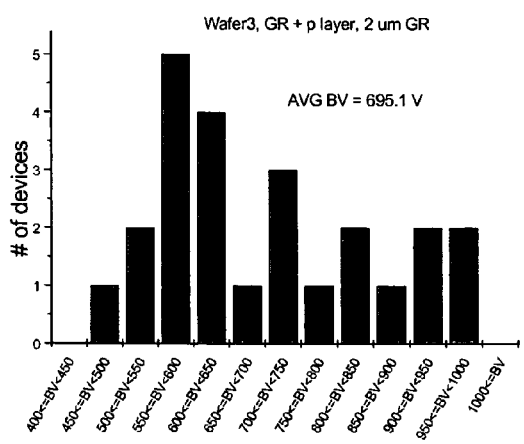
Figure 9H:
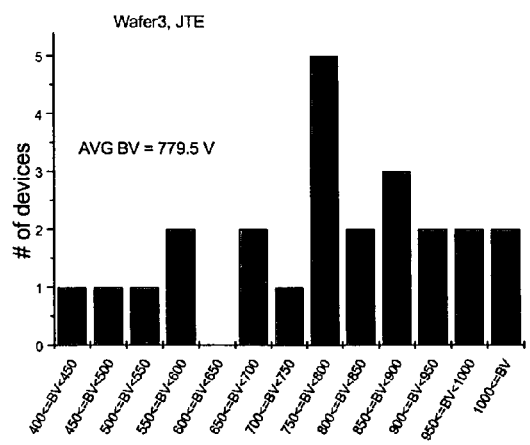
Figure 10A:
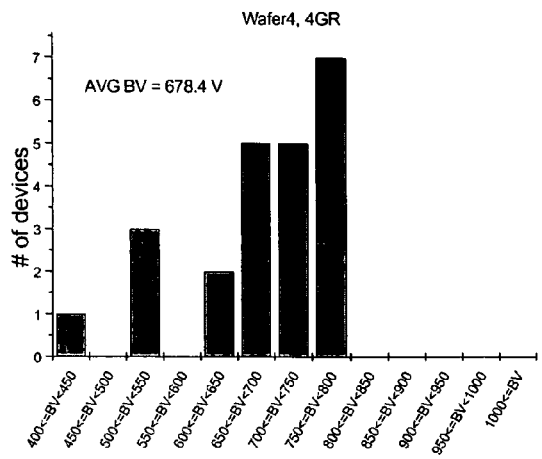
Figure 10B:
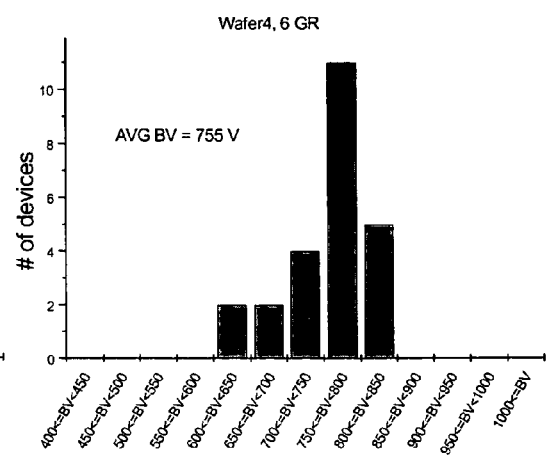
Figure 10C:
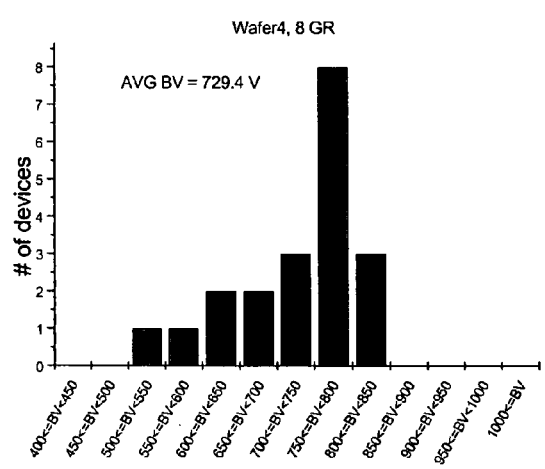
Figure 10D:
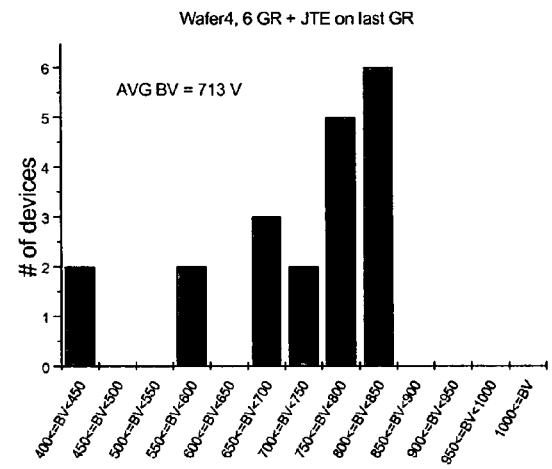
Figure 10E:
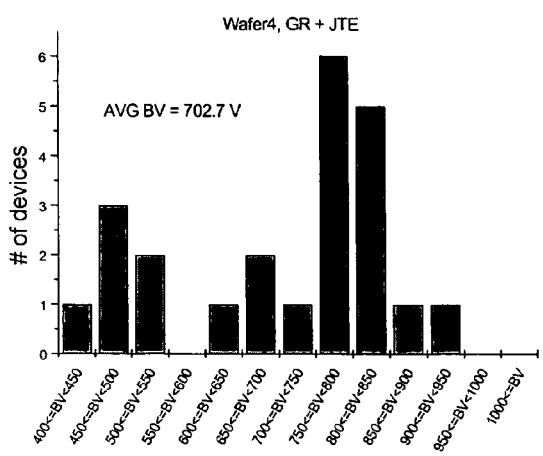
Figure 10F:
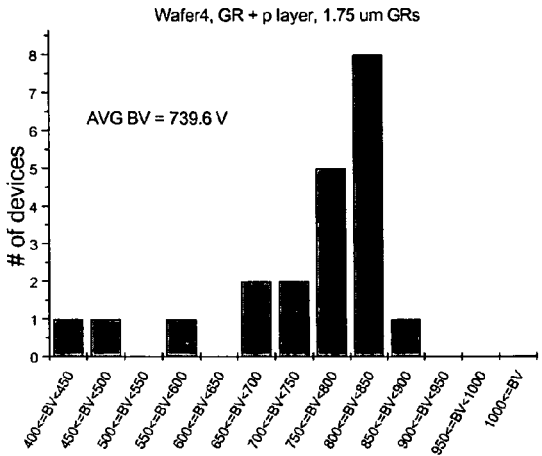
Figure 10G:
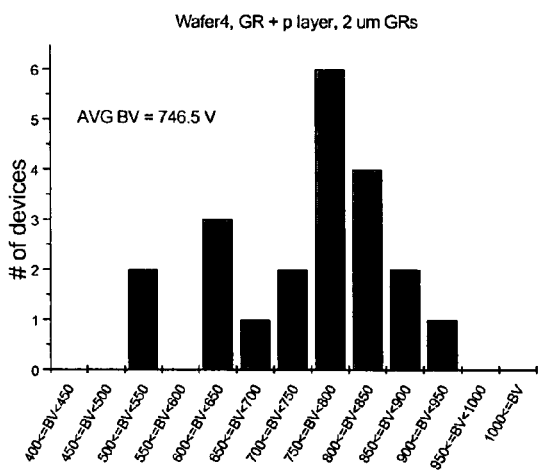
Figure 10H:
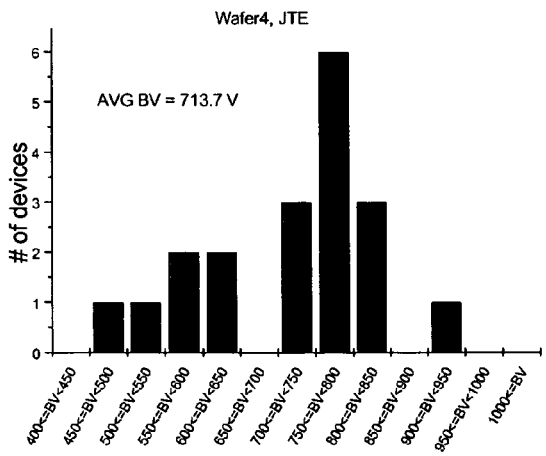
Figure 11A:
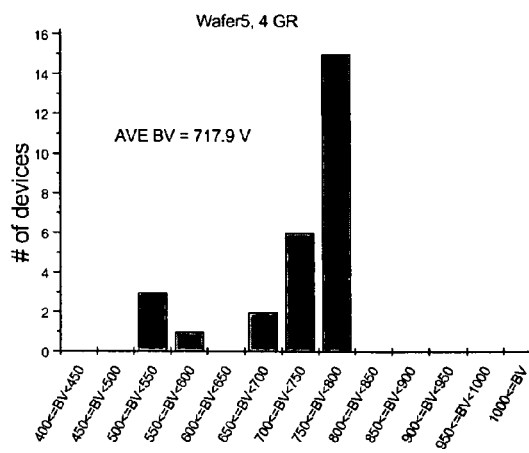
Figure 11B:
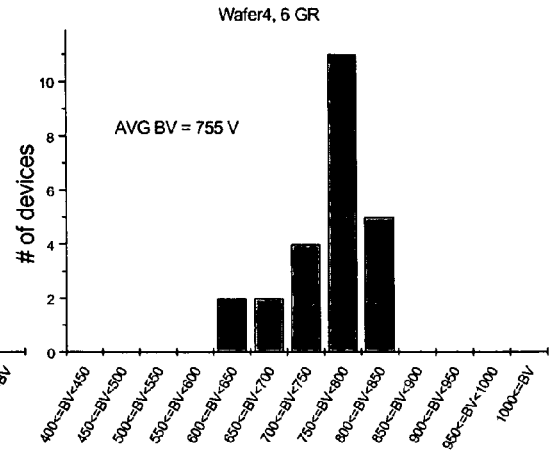
Figure 11C:
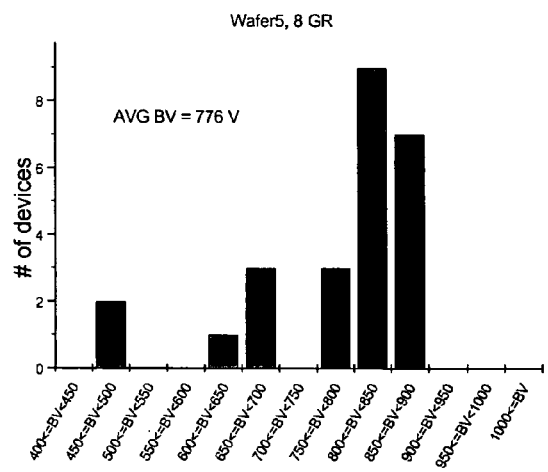
Figure 11D:
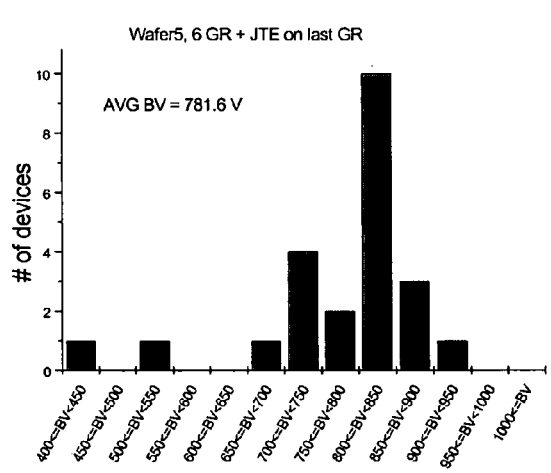
Figure 11E:
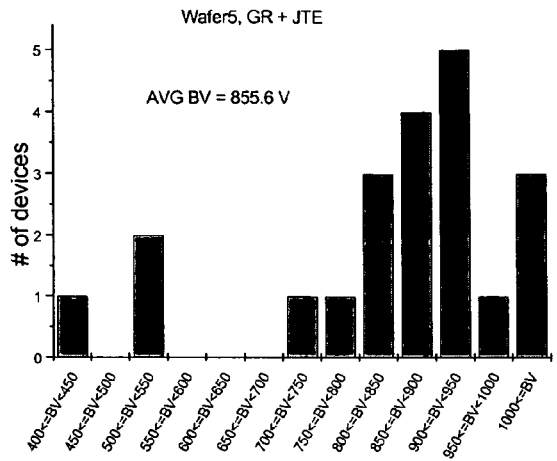
Figure 11F:
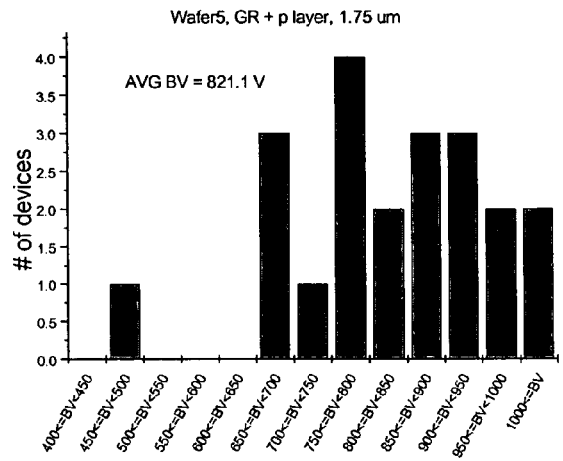
Figure 11G:
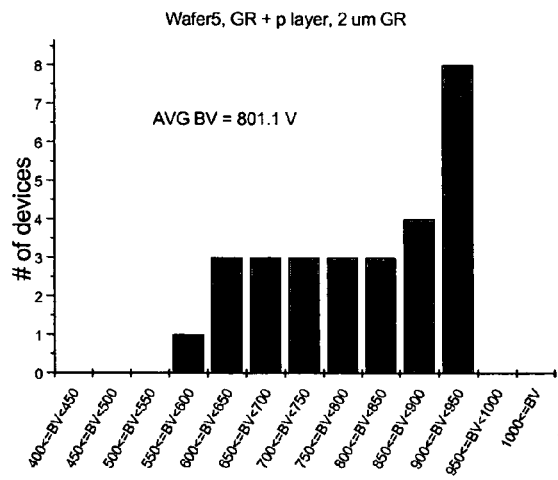
Figure 11H:
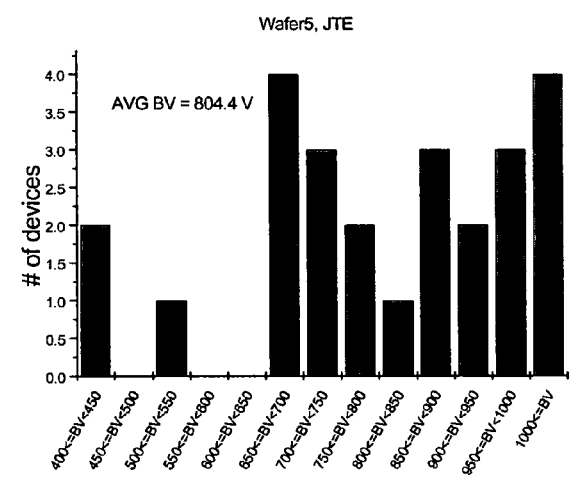
Figure 12A:
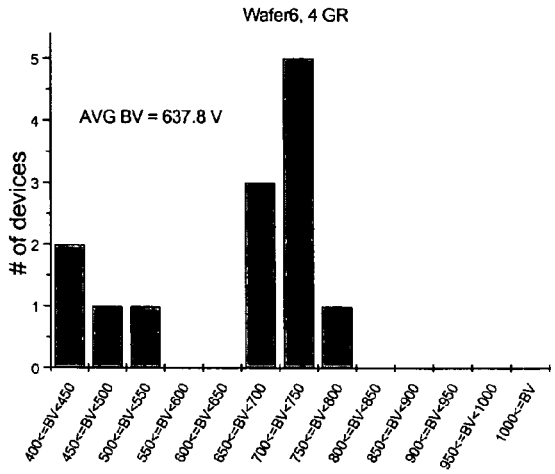
Figure 12B:
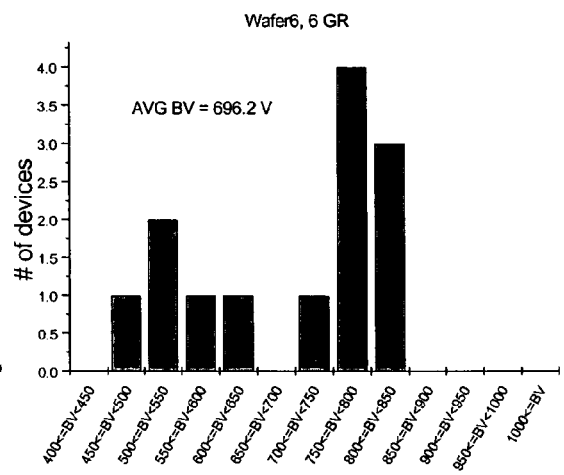
Figure 12C:
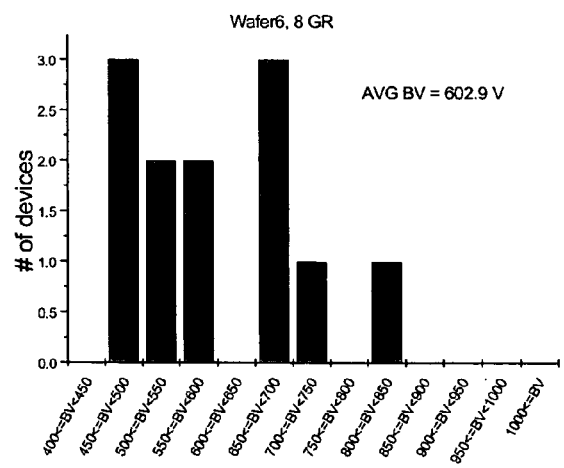
Figure 12D:
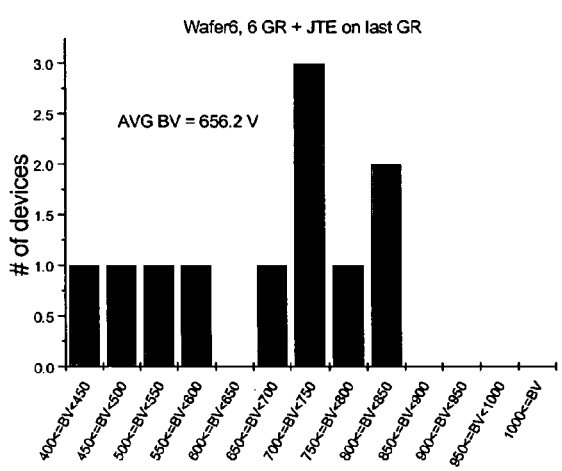
Figure 12E:
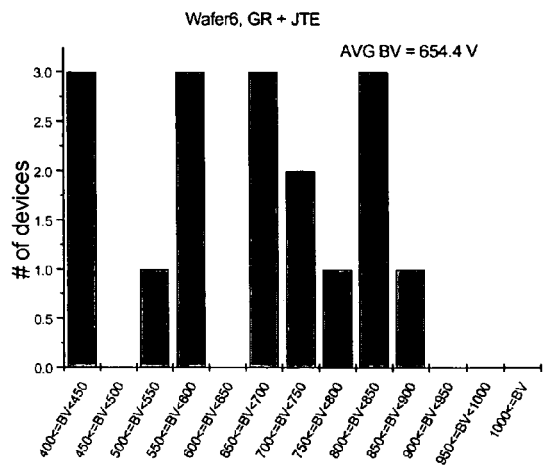
Figure 12F:
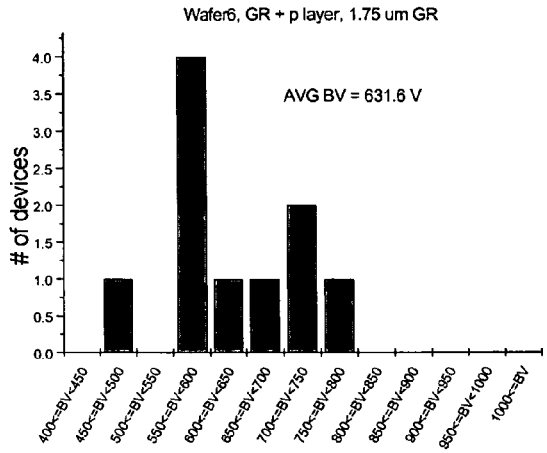
Figure 12G:
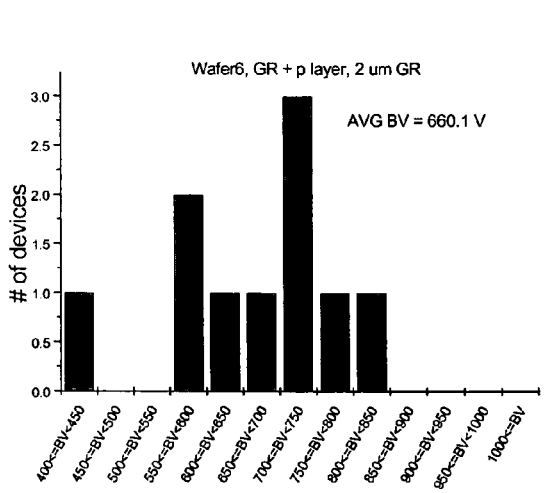
Figure 12H:
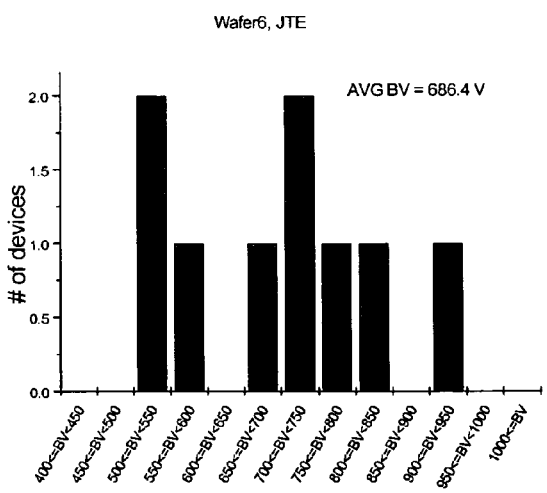

FIG. 6G illustrates the formation and patterning of a mask layer 140. The mask layer 140 may be formed utilizing conventional masking techniques and corresponds to the surface charge compensation regions. The windows in the mask may correspond to the junction 32 and/or guard rings 34. Utilizing the mask layer 140 as an ion implantation mask, ions are implanted in the silicon carbide layer 30 to provide the junction 32 and/or the guard rings 34 (FIG. 6H). The mask layer 140 may then be removed (FIG. 6I) and the insulating layer 26 formed on the resulting structure (FIG. 6J). The insulating layer 26 may, for example, be formed by thermal oxidation and/or depositing an oxide on the resulting structure.

While embodiments of the present invention have been described with reference to particular operations in fabrication, particular mask patterns and the like, as will be appreciated by one of skill in the art in light of the present disclosure, other operations, sequences of operations, mask patterns and the likes may be utilized while still benefiting from the teachings of the present invention. For example, a different sequence of implantation of guard rings and surface charge compensation regions may be provided. Furthermore, the particular operations in fabrication of the device may depend on the device being fabricated. Thus, for example, the fabrication of a transistor may have different fabrication steps than the fabrication of a diode. Accordingly, embodiments of the present invention should not be construed as limited to particular operations in fabrication but may encompass fabrication operations that provide edge termination structures as described herein.

EXAMPLES

The following examples are illustrative of particular embodiments of the present invention and should not be construed as limiting embodiments of the present invention.

Schottky diodes with a 1.58 mm² active area were fabricated utilizing junction termination techniques according to embodiments of the present invention. The various junction termination configurations are described in Table 1 below. In Table 1, the devices are identifed by the number of guard rings (GR), whether a junction termination extension (JTE) was present, and if so, where the JTE was located and if the charge compensation layer (p layer) was present in the device. The reference to 1-zone JTE refers to a device having a single doping level JTE. The various physical and electrical characteristics of the devices are also provided in Table 1. In Table 1, BV refers to breakdown voltage and the average (AVE) and maximum (MAX) breakdown voltage for devices on one of the six wafers fabricated are provided.

TABLE 1

| Junction Termination Test Samples | | | | | | | | |
|---|---|---|---|---|---|---|---|---|
| | 4 GR | 6 GR | 6 GR + JTE on Last GR | 8 GR | 6 GR + p layer A | 6 GR + p layer B | GR + JTE (Kinoshita et al) | 1-zone JTE |
| GR width | | | | | 3.25 μm | 3.0 μm | | |
| GR spacing | | | | | 1.75 μm | 2.0 μm | | |
| Active P layer dose | | | | | 3e12 | 3e12 | | |
| Active JTE dose | | | | | | | 1e13 | 1e13 |
| BV walkout | MOST | MOST | MOST | MOST | SOME | SOME | SOME | LEAST |
| Wafer1 AVE BV | 606.7 | 670.0 | 593 | 678 | 707 | 722 | 664.5 | 711.4 |
| Wafer1 Max BV | 742 | 787 | 808 | 824 | 851 | 870 | 820 | 825 |
| Wafer2 AVE BV | 623.7 | 639.2 | 660.0 | 676.3 | 685.6 | 722.2 | 712.6 | 741.9 |
| Wafer2 Max BV | 715 | 763 | 740 | 755 | 866 | 880 | 905 | 850 |
| Wafer3 AVE BV | 671.6 | 709.2 | 720.1 | 736.9 | 739.4 | 695.1 | 793.3 | 779.5 |
| Wafer3 Max BV | 748 | 817 | 836 | 843 | 907 | 968 | 979 | 1056 |
| Wafer4 AVE BV | 678.4 | 755 | 713 | 729.4 | 739.6 | 746.5 | 702.7 | 713.7 |
| Wafer4 Max BV | 906 | 880 | 922 | 904 | 915 | 885 | 790 | 905 |
| Wafer5 AVE BV | 717.9 | 755 | 781.6 | 776 | 821.1 | 801.1 | 855.6 | 804.4 |
| Wafer5 Max BV | 790 | 915 | 905 | 885 | 1007 | 947 | 1100 | 1046 |
| Wafer6 AVE BV | 637.8 | 696.2 | 656.2 | 602.9 | 631.6 | 660.1 | 654.4 | 686.4 |
| Wafer6 Max BV | 760 | 836 | 817 | 805 | 782 | 820 | 851 | 926 |

Six wafers were fabricated with doping densities for Wafer1 of ~7.1e15, Wafer2 of ~7.7e15, Wafer3 of 6.25e15, Wafer4 of 6.3e15, Wafer5 of 5.3e15 and Wafer6 of5.5e15. All implants of the p-layer devices were performed at room temperature with a photoresist mask. However, other implant temperatures could be utilized. Boron was used as the dopant for all devices. FIGS. 7A through 12H are distribution plots for devices having the various termination types for the six wafers described in Table 1. As is seen from Table 1, the lightly doped p-layer may provide an improvement over similar guard ring devices without the charge compensation layer.

FIGS. 7A through 12H illustrate the breakdown voltage distribution between the devices of Table 1. FIGS. 7A, 8A, 9A, 10A, 11A and 12A are distribution plots of breakdown voltages for Schottky devices having a four guard ring termination structure provided on six separate wafers. FIGS. 7B, 8B, 9B, 10B, 11B and 12B are distribution plots of breakdown voltages for Schottky devices having a six guard ring termination structure provided on six separate wafers. FIGS. 7C, 8C, 9C, 10C, 11C and 12C are distribution plots of breakdown voltages for Schottky devices having an eight guard ring termination structure provided on six separate wafers. FIGS. 7D, 8D, 9D, 10D, 11D and 12D are distribution plots of breakdown voltages for Schottky devices having an eight guard ring with a JTE at the last guard ring termination structure provided on six separate wafers. FIGS. 7E, 8E, 9E, 10E, 11E and 12E are distribution plots of breakdown voltages for Schottky devices having a guard ring and JTE termination structure provided on six separate wafers similar to that described in Kinoshita et al., "Guard Ring Assisted RESURF: A New Termination Structure Providing Stable and High Breakdown Voltage for SiC Power Devices," Tech. Digest of ISPSD '02, pp. 253-256 (the Japan Paper). FIGS. 7F, 8F, 9F, 10F, 11F and 12F are distribution plots of breakdown voltages for Schottky devices having a 1.75 μm guard ring with a charge compensation layer termination structure provided on six separate wafers. FIGS. 7G, 8G, 9G, 10G, 11G and 12G are distribution plots of breakdown voltages for Schottky devices having a 2.0 μm guard ring with a charge compensation layer termination structure provided on six separate wafers. FIGS. 7H, 8H, 9H, 10H, 11H and 12H are distribution plots of breakdown voltages for Schottky devices having a JTE termination structure provided on six separate wafers.

As discussed above, conventional guard-ring based SiC Schottky devices may suffer from anodic oxidation of the surface of the silicon carbide, which may be associated with significant current flow through the guard rings in the reverse blocking state. In a conventional SiC Schottky diode, an organic protective layer, such as a polyimide, may be formed on the surface of the SiC substrate in order to provide environmental and/or physical protection to the SiC device, including the edge termination structure. Unfortunately, however, a polyimide protective layer may contain and/or absorb a significant amount of moisture.

Figure 13:
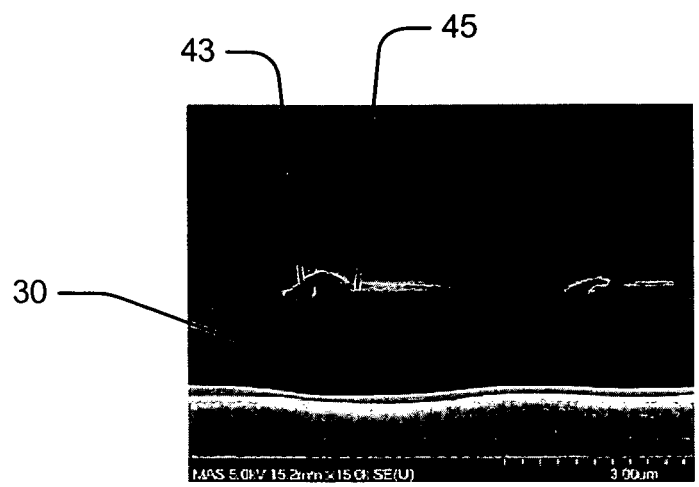
FIG. 13 is a cross-sectional TEM of a 4H-SiC Schottky diode showing anodic oxidation of the silicon carbide surface.

In an anodic oxidation process, oxygen contained in moisture in a polyimide layer on the silicon carbide surface may react with the silicon carbide substrate in the presence of electric current caused by high electric fields to form silicon oxide. Anodic oxidation of the silicon carbide surface may result in a poor quality oxide layer on the silicon carbide surface, which may reduce the effectiveness of the edge termination. An example of anodic oxidation at the surface of a silicon carbide Schottky device is shown in FIG. 13, which is a cross-sectional transmission electron microscopy (TEM) image of a device. As shown in FIG. 13, a small void 43 and a solid material 45 may be formed at the surface of a silicon carbide layer 30 near the guard rings. Energy Dispersive X-ray (EDX) analysis of the solid material indicates that it includes silicon and oxygen, which strongly suggests anodic oxidation of the silicon carbide surface.

Some embodiments of the invention provide edge termination structures which may reduce the peak surface electric fields in a SiC device. Reducing the peak surface electric fields may reduce anodic oxidation. However, even with reduced surface electric fields, there may be some anodic oxidation of the surface of the silicon carbide device, which may adversely affect device performance.

Figure 14:
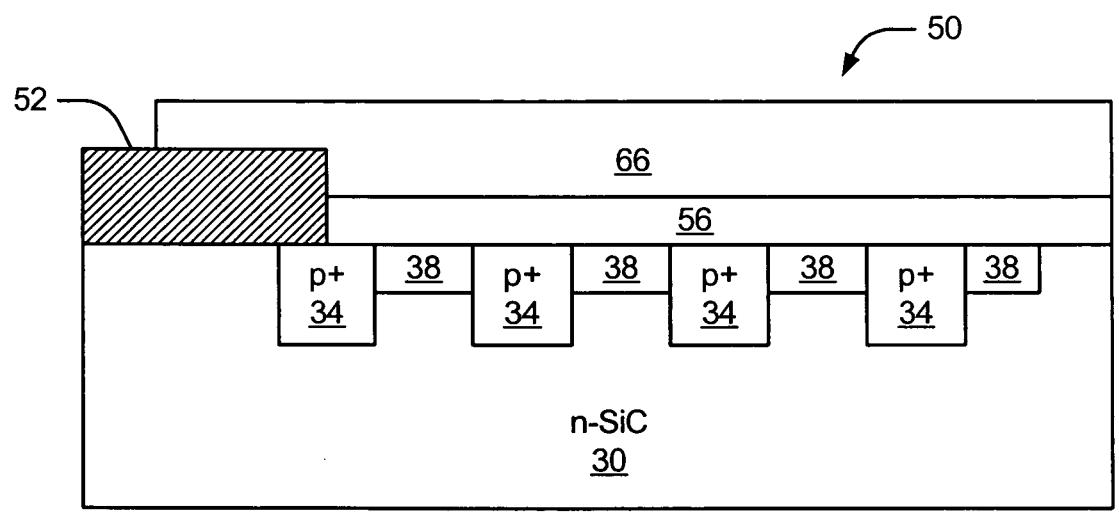
FIG. 14 is a cross-sectional illustration of a SiC Schottky diode having an edge termination according to some embodiments of the invention.
Figure 15:
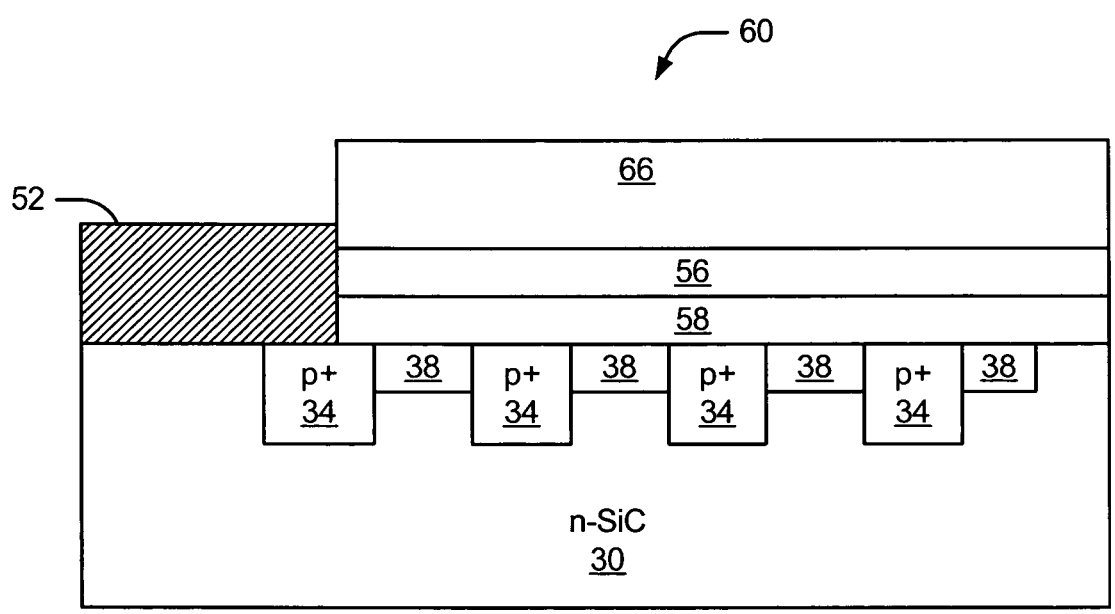
FIG. 15 is a cross-sectional illustration of a SiC Schottky diode having an edge termination according to further embodiments of the invention.

In order to reduce the occurrence of anodic oxidation, it may be desirable to provide a moisture barrier layer on the silicon carbide surface to reduce and/or possibly prevent moisture contained and/or absorbed within an organic protective layer from reacting with silicon in the silicon carbide. For example, as shown in FIG. 14, some embodiments of the invention provide a device structure 50 including a silicon carbide layer 30, such as a lightly doped n-type silicon carbide layer, having thereon a Schottky contact 52 forming a Schottky junction with the n-type silicon carbide layer 30, and a plurality of floating guard rings 34, such as p-type silicon carbide floating guard rings surrounding the Schottky junction. A JBS grid (not shown) may be provided beneath the Schottky contact 52. Thin regions 38 of silicon carbide, such as p-type silicon carbide, are provided between the spaced apart floating guard rings 34 to spread the equipotential lines to reduce the surface field and thus provide surface charge compensation regions or layers 36, as discussed in detail above. The thin regions 38 of p-type silicon carbide may extend completely between adjacent guard rings 34 as shown in FIG. 15. Alternatively, the thin regions 38 of p-type silicon carbide may extend only partially between adjacent guard rings 34, for example, as discussed in connection with FIG. 3.

An organic protective layer 66, which may include polyimide, is formed on the surface of the device structure 50. The protective layer 66 may extend up to and/or partially onto the Schottky contact 52, and may extend across the edge termination structure including the floating guard rings 34 and the p-type silicon carbide regions 38. In addition, a moisture barrier 56 is provided between the silicon carbide layer 30 and the protective layer 66. The moisture barrier 56 may include, for example, a thin layer of silicon nitride (SiN), which may be formed, for example, by reactive sputtering and/or plasma-enhanced chemical vapor deposition (PECVD). The moisture barrier 56 may reduce and/or possibly prevent moisture in the protective layer 66 from coming into proximity with the guard rings 34 while they are sustaining a high voltage and in which leakage current may flow. Thus, anodic oxidation at the surface of the silicon carbide layer 32 may be reduced and/or suppressed. One or more of the protective layers may be formed as described, for example, in copending and commonly assigned U.S. Pat. No. 7,598,576, filed Jan. 10, 2006, entitled "Environmentally Robust Passivation Structures for High-Voltage Silicon Carbide Semiconductor Devices," the disclosure of which is incorporated herein by reference.

A silicon nitride moisture barrier layer 56 may have a thickness of about 500 Å to about 1 μm. In particular embodiments, the SiN moisture barrier layer 56 may be deposited over a surface of the silicon carbide layer 30 including the Schottky contact 52. The polyimide protective layer 66 may be deposited and patterned on the silicon nitride layer 56 using conventional photolithography techniques, and the silicon nitride layer 56 may be selectively etched using the patterned polyimide protective layer 66 as an etch mask.

Further embodiments of the invention are illustrated in FIG. 15. As shown therein, a device structure 60 is similar to the device structure 50 shown in FIG. 14. That is, the device structure 60 includes a lightly doped n-type silicon carbide layer 30 having thereon a Schottky contact 52 forming a Schottky junction, and a plurality of floating guard rings 34, such as p-type silicon carbide floating guard rings, in the SiC layer 30 surrounding the Schottky junction. Thin regions 38 of p-type silicon carbide are provided between the spaced apart floating guard rings 34, and an organic protective layer 66 is formed on the surface of the device structure 60. A moisture barrier 56 is provided between the organic protective layer 66 and the silicon carbide layer 30.

In addition, the device structure 60 includes a surface passivation layer 58 between the silicon carbide layer 30 and the moisture barrier 56. The surface passivation layer 58 may include a high quality oxide layer, such as a thermal oxide layer, which may be formed before formation of the moisture barrier 56. The passivation layer 58 may provide a high-quality surface passivation of the silicon carbide layer 30, which may, for example, reduce the density of interface states at or near the surface of the silicon carbide layer 30. A thermal oxide passivation layer 58 may have a thickness of about 5 nm to about 100 nm.

Figure 16A:
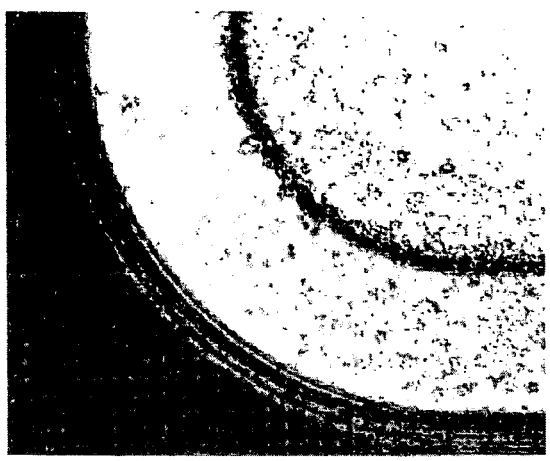
FIG. 16A is a plan view photograph of an edge termination structure of a conventional SiC Schottky diode showing significant anodic oxidation.

FIG. 16A is a plan view photograph of an edge termination structure of a conventional SiC Schottky diode that does not include the thin p-type silicon carbide regions 38 between adjacent guard rings. The device illustrated in FIG. 16A, which includes a polyimide protective layer, was subjected to an environmental test in which the anode of the device was grounded, and voltage on the cathode of the diode was cycled from 0V to 600V at a frequency of 10 kHz for 518 hours. For the first 350 hours of the test, the device was voltage-cycled in an inert nitrogen ($N_2$) ambient. For the last 168 hours of the test, the ambient was air, which contains a significant amount of moisture. The photograph shows significant anodic oxidation in the vicinity of the guard rings following the voltage cycling.

Figure 16B:
FIG. 16B is a plan view photograph of an edge termination structure of a SiC Schottky diode according to some embodiments of the invention showing reduced anodic oxidation.

FIG. 16B is a plan view photograph of an edge termination structure of a SiC Schottky diode including thin p-type silicon carbide regions 38 between adjacent guard rings 34, but without a moisture barrier layer. The device shown in FIG. 16B was also subjected to 100V/600V cycling for 350 hours in nitrogen and 168 hours in air. After voltage cycling, the device in FIG. 16B exhibited some anodic oxidation, but less than the device shown in FIG. 16A, which may be attributable to reduced peak electric fields in the guard rings 34.

Figure 16C:
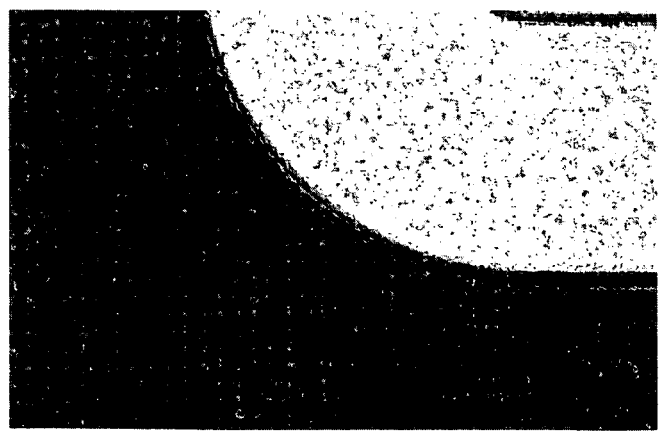
FIG. 16C is a plan view photograph of an edge termination structure of a SiC Schottky diode according to further embodiments of the invention showing significantly reduced anodic oxidation.

FIG. 16C is a plan view photograph of an edge termination structure of a SiC Schottky diode including thin p-type silicon carbide regions 38 between adjacent guard rings 34, and having a moisture barrier layer 56 on the surface of the silicon carbide layer 30. The device shown in FIG. 16B was also subjected to 100V/600V cycling for 350 hours in nitrogen and 168 hours in air. After testing, the device shown in FIG. 16C showed significantly reduced anodic oxidation, to the point where no signs of anodic oxidation were visible under an optical microscope at 200× magnification.

While a Schottky diode has been described as an exemplary embodiment of the present invention, other types of device structures which support high reverse blocking voltages, such as PIN diodes, thyristors, JFETs, etc., may employ an edge termination structure according to embodiments of the invention.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An edge termination structure for a silicon carbide semiconductor device, comprising:
   a plurality of spaced apart concentric floating guard rings in a silicon carbide layer, the plurality of spaced apart concentric floating guard rings at least partially surrounding a silicon carbide-based junction;
   a Schottky contact on the silicon carbide layer, the Schottky contact forming a Schottky junction with the silicon carbide layer;
   an insulating structure on the silicon carbide layer, the insulating structure comprising a passivation layer on the silicon carbide layer and a silicon nitride layer on the passivation layer;
   an organic protective layer on the silicon nitride layer, wherein the organic protective layer comprises polyimide; and
   a plurality of silicon carbide surface charge compensation regions between the floating guard rings and adjacent the silicon carbide layer,
   wherein bottom surfaces of the plurality of floating guard rings are planar and located deeper in the silicon carbide layer than planar bottom surfaces of the plurality of silicon carbide surface charge compensation regions
   wherein sidewalls of the passivation layer, the silicon nitride layer and the organic protective layer are aligned with a sidewall of the Schottky contact.

2. The edge termination structure of claim 1, wherein the passivation layer comprises an oxide layer on the silicon carbide layer between the silicon carbide layer and the silicon nitride layer.

3. The edge termination structure of claim 2, wherein the passivation layer comprises a thermal oxide layer having a thickness of from about 5 nm to about 100 nm and wherein the silicon nitride layer has a thickness of from about 500 Å to about 1 µm.

4. The edge termination structure of claim 1, wherein the organic protective layer has a higher moisture content than a moisture content of the silicon nitride layer.

5. The edge termination structure of claim 1, wherein the surface charge compensation region is lighter doped than the guard rings.

6. The edge termination structure of claim 1, wherein the surface charge compensation region extends completely between adjacent ones of the floating guard rings.

7. The edge termination structure of claim 1, wherein the surface charge compensation region extends between adjacent ones of the floating guard rings but does not extend completely between two adjacent floating guard rings.

8. The edge termination structure of claim 1, wherein the surface charge compensation region comprises a second silicon carbide layer on the silicon carbide layer.

9. The edge termination structure of claim 1, wherein the surface charge compensation region has a dose charge of from about $1 \times 10^{12}$ to about $7 \times 10^{12}$ cm$^{-2}$.

10. The edge termination structure of claim 1, wherein the silicon carbide layer exhibits substantially no anodic oxidation when the device is exposed to a reverse bias voltage cycled between 0 and 600V at 10 kHz in $N_2$ for 350 hours followed by air for 168 hours.

11. The edge termination structure of claim 1, wherein the passivation layer on the silicon carbide layer and the silicon nitride layer on the passivation layer are formed using chemical vapor deposition.

12. The edge termination structure of claim 3, wherein the thermal oxide layer comprise silicon dioxide.

13. The edge terminal structure of claim 3, wherein the insulating structure further comprises an additional thermal oxide layer on the silicon nitride layer and an additional silicon nitride layer on the additional thermal oxide layer.

14. The edge termination structure of claim 1, wherein the organic protection layer extends at least partially onto the Schottky contact.

15. An edge termination structure for a silicon carbide semiconductor device, comprising:
   a plurality of spaced apart concentric floating guard rings in a silicon carbide layer, the plurality of spaced apart concentric floating guard rings at least partially surrounding a silicon carbide-based junction;
   a Schottky contact on the silicon carbide layer, the Schottky contact forming a Schottky junction with the silicon carbide layer;
   an insulating structure on the silicon carbide layer, the insulating structure comprising an oxide layer on the silicon carbide layer;
   a moisture barrier on the silicon carbide layer, and
   an environmental protection layer on the moisture barrier, wherein the moisture barrier and the environmental protection layer comprise different materials and wherein the moisture barrier is between the environmental protection layer and the silicon carbide layer; and a plurality of silicon carbide surface charge compensation regions between the floating guard rings and adjacent the silicon carbide layer, wherein bottom surfaces of the plurality of floating guard rings are planar and located deeper in the silicon carbide layer than planar bottom surfaces of the plurality of silicon carbide surface charge compensation regions, wherein sidewalls of the oxide layer, the moisture barrier and the environmental protection layer are aligned with a sidewall of the Schottky contact.

16. The edge termination structure of claim 15, further comprising:

a passivation layer between the silicon carbide layer and the moisture barrier layer, wherein the passivation layer and the moisture barrier comprise different materials.

17. The edge termination structure of claim 16, wherein the passivation layer comprises a thermal oxide.

18. The edge termination structure of claim 17, wherein the thermal oxide comprises silicon dioxide.

19. The edge termination structure of claim 16, wherein the moisture barrier comprises silicon nitride.

20. The edge termination structure of claim 16, wherein the environmental protection layer comprises polyimide.

21. The edge termination structure of claim 16, wherein the environmental protection layer extends at least partially onto the Schottky contact.

* * * * *

UNITED STATES PATENT AND TRADEMARK OFFICE
CERTIFICATE OF CORRECTION

PATENT NO. : 9,515,135 B2  
APPLICATION NO. : 11/331325  
DATED : December 6, 2016  
INVENTOR(S) : Ryu et al.

Page 1 of 1

It is certified that error appears in the above-identified patent and that said Letters Patent is hereby corrected as shown below:

In the Specification

Column 12, Line 32: Please correct "of5.5e15." to read -- of 5.5e15. --

Signed and Sealed this
Thirtieth Day of May, 2017

Michelle K. Lee
*Director of the United States Patent and Trademark Office*